(12) United States Patent
Yamazaki

(10) Patent No.: US 9,905,632 B2
(45) Date of Patent: Feb. 27, 2018

(54) LIGHT-EMITTING UNIT, LIGHT-EMITTING DEVICE, AND LIGHTING DEVICE

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 64 days.

(21) Appl. No.: 13/331,108

(22) Filed: Dec. 20, 2011

(65) Prior Publication Data

US 2012/0161174 A1    Jun. 28, 2012

(30) Foreign Application Priority Data

Dec. 28, 2010    (JP) ................................. 2010-293919

(51) Int. Cl.
H01L 27/32    (2006.01)

(52) U.S. Cl.
CPC ...... H01L 27/3283 (2013.01); H01L 27/3204 (2013.01); H01L 2251/5361 (2013.01)

(58) Field of Classification Search
CPC ....... H01L 33/08; H01L 33/40; H01L 27/153; H01L 2251/50; H01L 2251/53; H01L 2251/5361; H01L 27/3204; H01L 27/3283
USPC ... 257/40, 88–89, 91, 93, E27.121, E33.062, 257/E33.065; 315/307, 504–506
See application file for complete search history.

(56) References Cited

U.S. PATENT DOCUMENTS

| | | |
|---|---|---|
| 2,972,692 A | 2/1961 | William et al. |
| 3,833,833 A | 9/1974 | Nelson |
| 4,298,869 A | 11/1981 | Okuno |
| 5,935,721 A | 8/1999 | Shi et al. |
| 5,939,839 A | 8/1999 | Robel et al. |

(Continued)

FOREIGN PATENT DOCUMENTS

| | | |
|---|---|---|
| CN | 001711640 A | 12/2005 |
| CN | 1893105 | 1/2007 |

(Continued)

OTHER PUBLICATIONS

Copending U.S. Appl. No. 13/337,631.*

(Continued)

Primary Examiner — Lauren R Bell
(74) Attorney, Agent, or Firm — Robinson Intellectual Property Law Office; Eric J. Robinson

(57) ABSTRACT

The light-emitting unit includes a first light-emitting element and a second light-emitting element over an insulating surface. The first light-emitting element includes a first electrode, a second electrode, and a layer containing a light-emitting organic compound interposed between the first and second electrodes. An edge portion of the first electrode is covered with a first insulating partition wall. The second light-emitting element includes a third electrode, a fourth electrode, a light-emitting organic compound interposed between the third and fourth electrodes. The first and third electrodes are formed from the same layer having a property of transmitting light emitted from the light-emitting organic compound. The second and fourth electrodes are formed from the same layer. The second electrode intersects with the edge portion of the first electrode with the first partition wall interposed therebetween, whereby the second electrode and the third electrode are electrically connected to each other.

22 Claims, 18 Drawing Sheets

(56) References Cited

U.S. PATENT DOCUMENTS

| | | | |
|---|---|---|---|
| 6,133,581 A * | 10/2000 | Terao et al. | 257/40 |
| 6,157,127 A | 12/2000 | Hosokawa et al. | |
| 6,335,713 B1 | 1/2002 | Imai | |
| 6,462,722 B1 | 10/2002 | Kimura et al. | |
| 6,522,315 B2 | 2/2003 | Ozawa et al. | |
| 6,693,296 B1 | 2/2004 | Tyan | |
| 6,717,358 B1 | 4/2004 | Liao et al. | |
| 6,747,639 B2 | 6/2004 | So | |
| 6,839,045 B2 | 1/2005 | Ozawa et al. | |
| 7,005,196 B1 | 2/2006 | Carter et al. | |
| 7,012,585 B2 | 3/2006 | Agostinelli et al. | |
| 7,068,418 B2 | 6/2006 | Kawase | |
| 7,122,398 B1 * | 10/2006 | Pichler | 438/66 |
| 7,148,632 B2 | 12/2006 | Berman et al. | |
| 7,180,483 B2 | 2/2007 | Kimura et al. | |
| 7,199,516 B2 | 4/2007 | Seo et al. | |
| 7,221,339 B2 | 5/2007 | Ozawa et al. | |
| 7,253,793 B2 | 8/2007 | Ozawa et al. | |
| 7,255,939 B2 | 8/2007 | Carter et al. | |
| 7,271,785 B2 | 9/2007 | Jang | |
| 7,285,801 B2 | 10/2007 | Eliashevich et al. | |
| 7,322,718 B2 | 1/2008 | Setomoto et al. | |
| 7,468,580 B2 | 12/2008 | Kawase | |
| 7,710,364 B2 | 5/2010 | Ozawa et al. | |
| 7,737,629 B2 | 6/2010 | Okuyama et al. | |
| 7,888,864 B2 | 2/2011 | Young | |
| 7,911,133 B2 | 3/2011 | Tyan et al. | |
| 7,999,463 B2 | 8/2011 | Nomura | |
| 8,552,440 B2 | 10/2013 | Yamazaki | |
| 8,575,631 B2 | 11/2013 | Yamazaki | |
| 2002/0196206 A1 | 12/2002 | Kimura et al. | |
| 2003/0048072 A1 | 3/2003 | Ishihara et al. | |
| 2003/0098827 A1 | 5/2003 | Ozawa et al. | |
| 2003/0117348 A1 | 6/2003 | Knapp et al. | |
| 2003/0122805 A1 | 7/2003 | So | |
| 2003/0141807 A1 | 7/2003 | Kawase | |
| 2003/0151360 A1 | 8/2003 | Fukunaga et al. | |
| 2003/0170491 A1 | 9/2003 | Liao et al. | |
| 2003/0189401 A1 | 10/2003 | Kido et al. | |
| 2003/0227253 A1 | 12/2003 | Seo et al. | |
| 2003/0231273 A1 | 12/2003 | Kimura et al. | |
| 2004/0021425 A1 | 2/2004 | Foust et al. | |
| 2004/0031957 A1 | 2/2004 | Tyan | |
| 2004/0032220 A1 | 2/2004 | Cok et al. | |
| 2004/0150591 A1 | 8/2004 | Ozawa et al. | |
| 2005/0077838 A1 | 4/2005 | Blumel | |
| 2005/0174064 A1 | 8/2005 | Agostinelli et al. | |
| 2005/0218791 A1 | 10/2005 | Kawase | |
| 2005/0225973 A1 | 10/2005 | Eliashevich et al. | |
| 2006/0108914 A1 * | 5/2006 | Young | 313/503 |
| 2006/0119253 A1 | 6/2006 | Carter et al. | |
| 2006/0220544 A1 * | 10/2006 | Okuyama et al. | 313/506 |
| 2006/0273995 A1 | 12/2006 | Ozawa et al. | |
| 2006/0273996 A1 | 12/2006 | Ozawa et al. | |
| 2006/0279491 A1 | 12/2006 | Ozawa et al. | |
| 2006/0284189 A1 | 12/2006 | Sakata et al. | |
| 2007/0075310 A1 * | 4/2007 | Lee | H01L 27/3211 257/40 |
| 2007/0182317 A1 | 8/2007 | Kido et al. | |
| 2008/0001512 A1 | 1/2008 | Nomura | |
| 2008/0137008 A1 * | 6/2008 | Rogojevic et al. | 349/69 |
| 2008/0224606 A1 * | 9/2008 | Kawai | H01L 27/3204 313/504 |
| 2008/0246704 A1 | 10/2008 | Kawase | |
| 2008/0278067 A1 | 11/2008 | Tyan et al. | |
| 2009/0047752 A1 | 2/2009 | Yamazaki et al. | |
| 2010/0044685 A1 * | 2/2010 | Kim et al. | 257/40 |
| 2010/0117523 A1 | 5/2010 | Tchakarov | |
| 2010/0277403 A1 | 11/2010 | Chao et al. | |
| 2011/0037054 A1 | 2/2011 | Shieh et al. | |
| 2011/0089814 A1 | 4/2011 | Nomura | |
| 2011/0089823 A1 | 4/2011 | Nomura | |
| 2011/0101388 A1 | 5/2011 | Nomura | |
| 2011/0140617 A1 | 6/2011 | Nomura | |
| 2012/0062108 A1 * | 3/2012 | Mima | 313/504 |
| 2012/0286250 A1 | 11/2012 | Yamamoto et al. | |

FOREIGN PATENT DOCUMENTS

| | | |
|---|---|---|
| CN | 101267702 | 9/2008 |
| CN | 101601079 A | 12/2009 |
| EP | 0 597 226 A1 | 5/1994 |
| EP | 0 895 219 A1 | 2/1999 |
| EP | 0 917 127 A1 | 5/1999 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 388 894 A2 | 2/2004 |
| EP | 1 408 563 A | 4/2004 |
| EP | 1 619 654 A1 | 1/2006 |
| EP | 1970960 A | 9/2008 |
| JP | 06-207170 A | 7/1994 |
| JP | 06-208342 A | 7/1994 |
| JP | 11-273856 A | 10/1999 |
| JP | 11-307261 A | 11/1999 |
| JP | 2000-029404 A | 1/2000 |
| JP | 2000-082588 A | 3/2000 |
| JP | 2002-132218 A | 5/2002 |
| JP | 2002-532848 | 10/2002 |
| JP | 2004-063210 A | 2/2004 |
| JP | 2004-069774 A | 3/2004 |
| JP | 2004-152699 A | 5/2004 |
| JP | 2004-234868 A | 8/2004 |
| JP | 2005-235491 | 9/2005 |
| JP | 2006-049853 | 2/2006 |
| JP | 2006-108651 | 4/2006 |
| JP | 2006-310289 A | 11/2006 |
| JP | 2007-234514 A | 9/2007 |
| JP | 2008-227326 A | 9/2008 |
| JP | 2009-021575 | 1/2009 |
| JP | 2009-130132 | 6/2009 |
| JP | 2010-519699 | 6/2010 |
| JP | 2010-527107 | 8/2010 |
| JP | 2010-277757 A | 12/2010 |
| JP | 2010277757 A * | 12/2010 |
| KR | 10-0760347 B | 9/2007 |
| KR | 2008-0084610 A | 9/2008 |
| WO | WO 98/36406 | 8/1998 |
| WO | WO 00/36662 | 6/2000 |
| WO | WO 03/037040 | 5/2003 |
| WO | WO-2004/044987 | 5/2004 |
| WO | WO-2008/070372 | 6/2008 |
| WO | WO-2008/140644 | 11/2008 |
| WO | WO-2010/116681 | 10/2010 |
| WO | WO-2010/137633 | 12/2010 |

OTHER PUBLICATIONS

Copending U.S. Appl. No. 13/371,055.*
Machine translation of JP 2010277757, translated Dec. 17, 2013.*
Copending U.S. Appl. No. 13/337,631, application date Dec. 27, 2011.*
Copending U.S. Appl. No. 13/371,055, application date Feb. 10, 2012.*
Tokito et al., "Metal Oxides as a Hole-Injecting Layer for an Organic Electroluminescent Device," J. Phys. D: Appl. Phys. (Journal of Physics D: Applied Physics), 1996, vol. 29, pp. 2750-2753.
International Search Report (Application No. PCT/JP2011/079959) Dated Jan. 31, 2012.
Written Opinion (Application No. PCT/JP2011/079959) Dated Jan. 31, 2012.
Chinese Office Action (Application No. 201180063265.0) Dated May 6, 2015.
Taiwanese Office Action (Application No. 100148072) Dated May 26, 2016. Full.

* cited by examiner

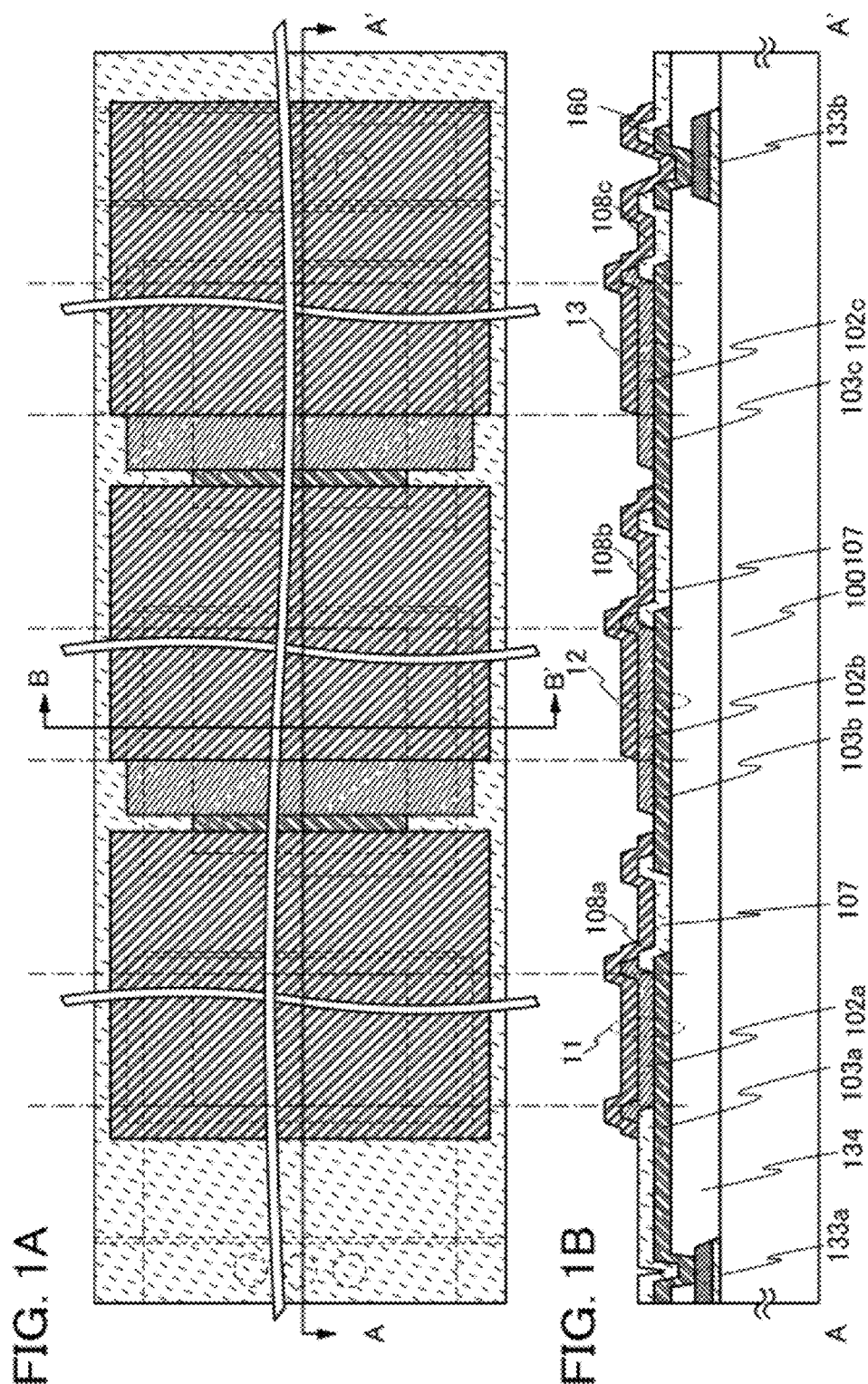

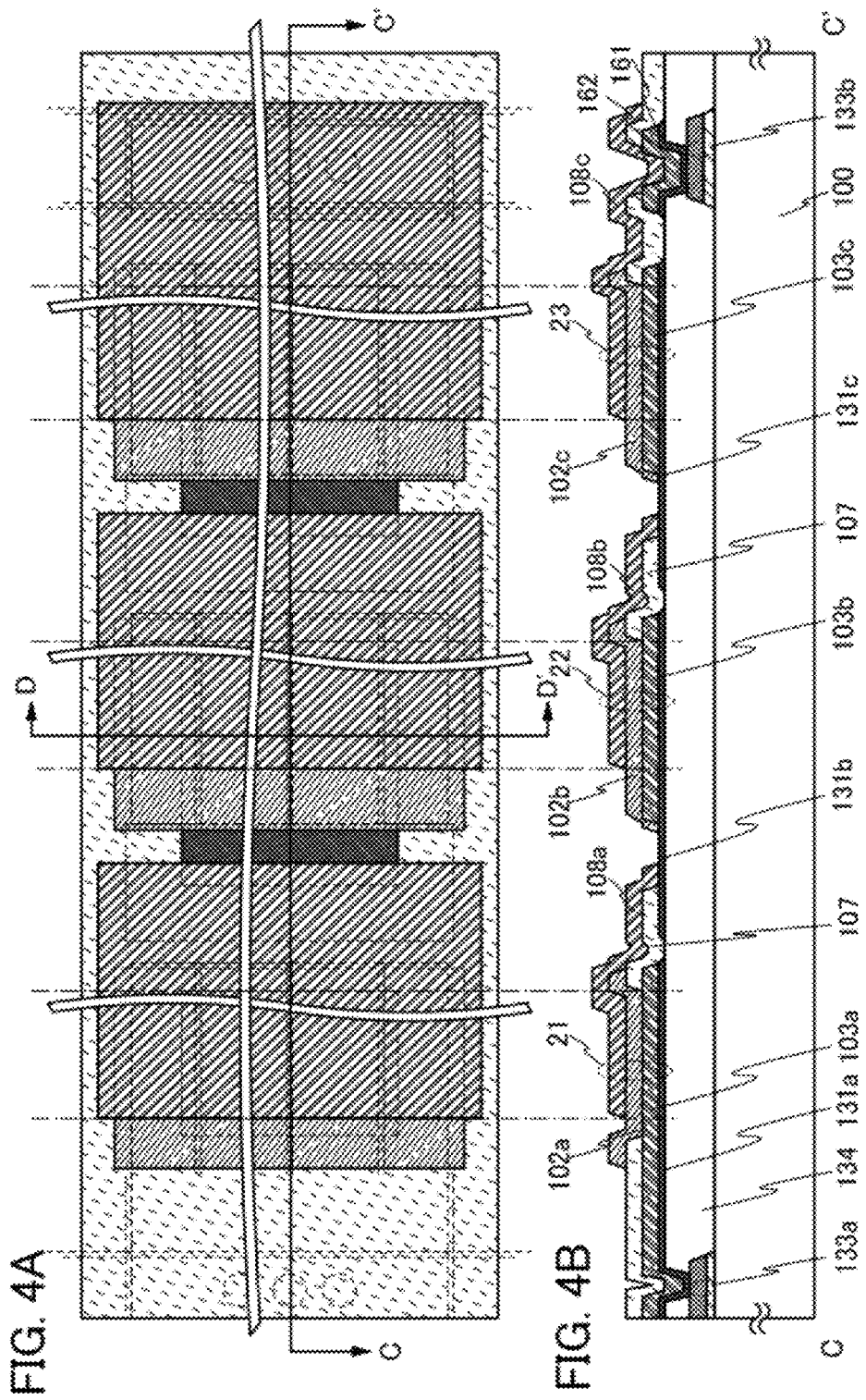

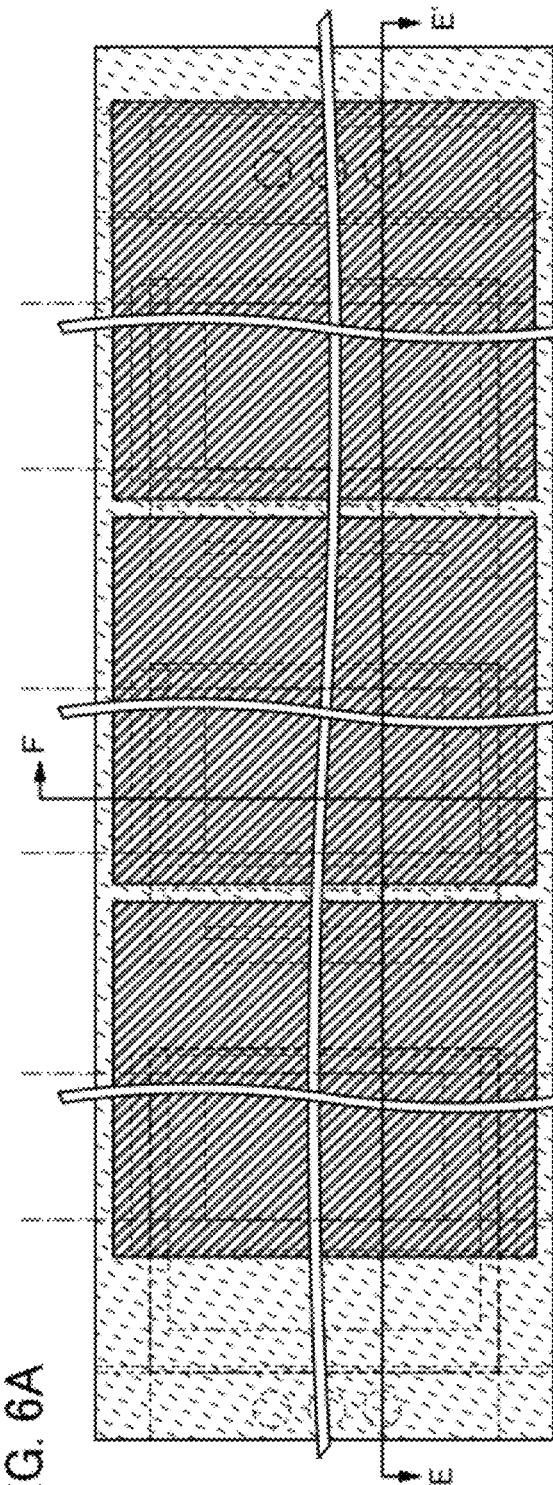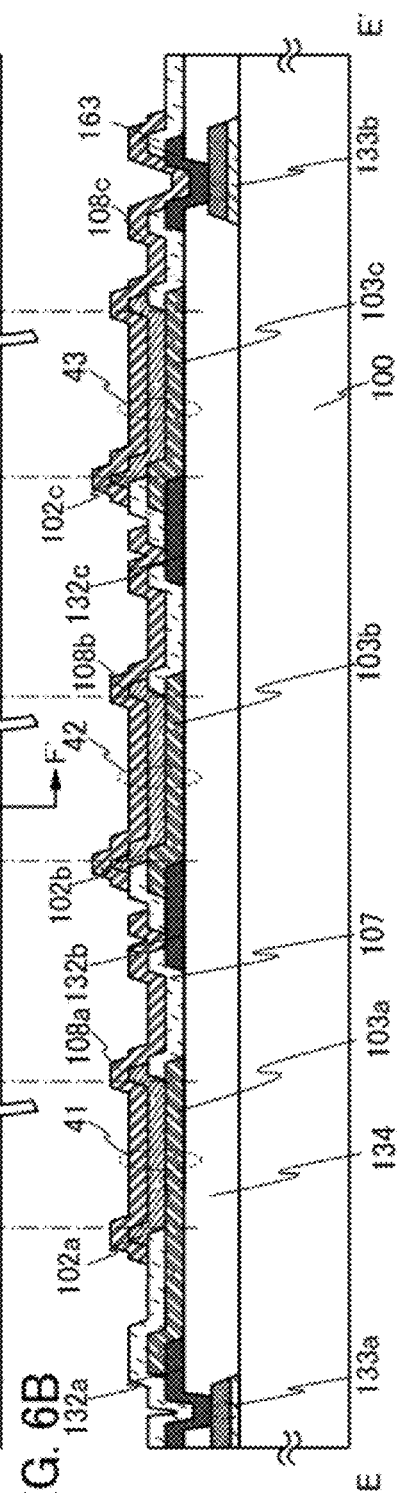
FIG. 6A
FIG. 6B

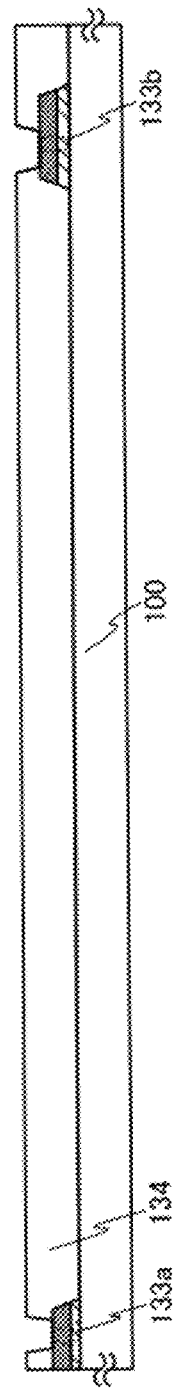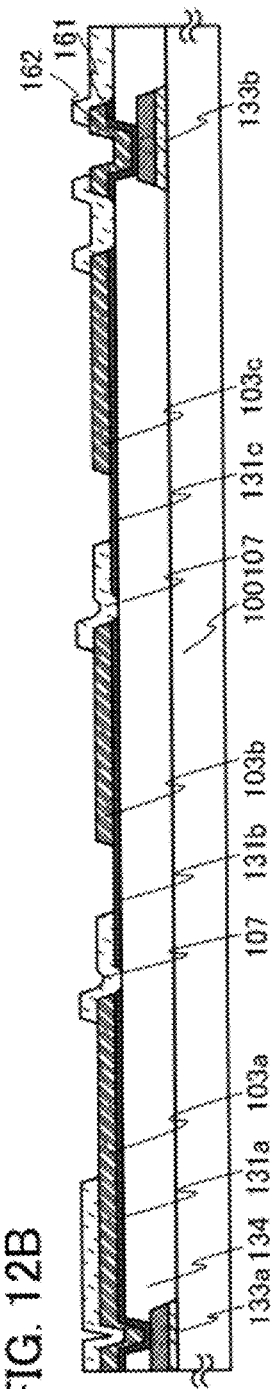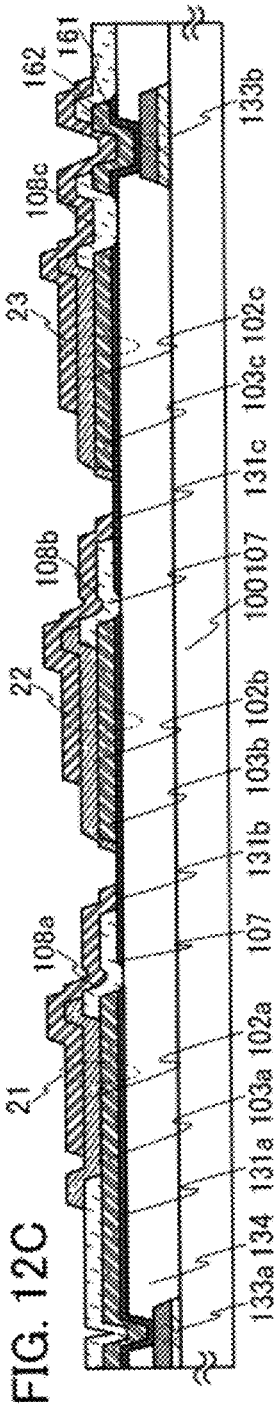

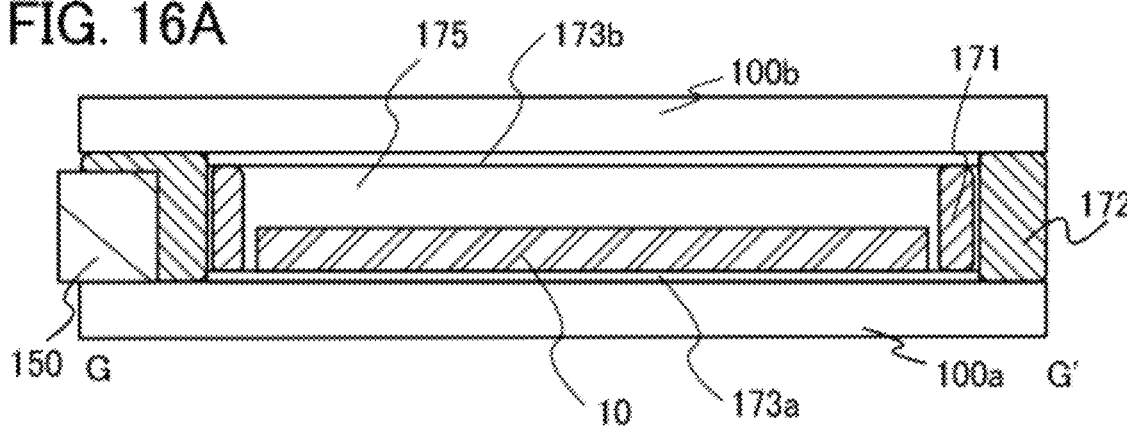
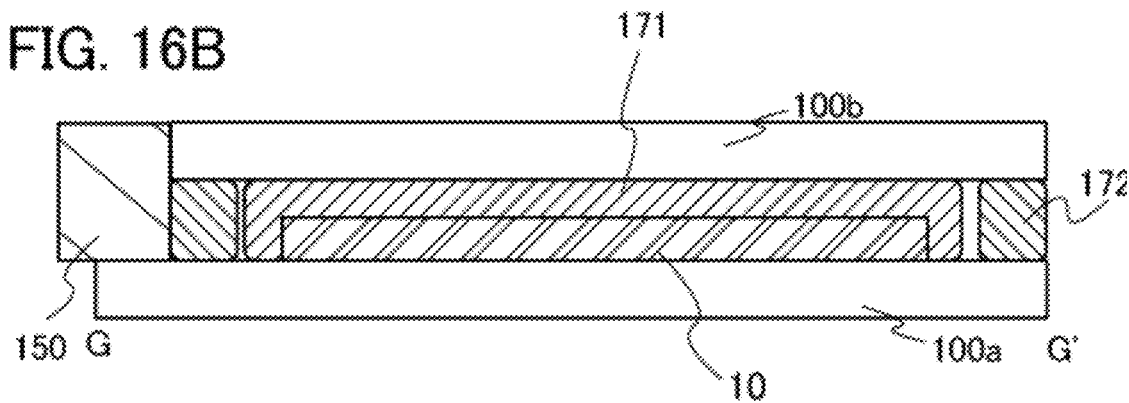

LIGHT-EMITTING UNIT, LIGHT-EMITTING DEVICE, AND LIGHTING DEVICE

TECHNICAL FIELD

One embodiment of the present invention relates to a light-emitting unit including a plurality of light-emitting elements utilizing organic electroluminescence (EL) (such a light-emitting element is also referred to as an organic EL element). One embodiment of the present invention relates to a light-emitting device and a lighting device each including the light-emitting unit.

BACKGROUND ART

An organic EL element has been actively researched and developed. In the fundamental structure of the organic EL element, a layer containing a light-emitting organic compound is interposed between a pair of electrodes. By applying voltage to this element, light can be emitted from the light-emitting organic compound.

The organic EL element can be formed into a film; thus, a large-area element can be easily formed. Therefore, the organic EL element has a high utility value as a surface light source that can be applied to lighting or the like.

For example, a lighting device including an organic EL element is disclosed in Patent Document 1.

REFERENCE

[Patent Document 1] Japanese Published Patent Application No. 2009-130132

DISCLOSURE OF INVENTION

An organic EL element can be driven at relatively low voltage, specifically, approximately 3 V to several tens of volts. Therefore, the organic EL element is suitable as a light-emitting element for use in which a power source with low output voltage (e.g., a battery) is used as a power source, specifically, a light-emitting element for portable use.

However, the voltage supplied from a home power line or the like is approximately 100 V to 240 V. Thus, the difference between the voltage and the driving voltage of the organic EL element is too big. In view of the above, a converter or the like which converts power supply voltage is needed when such a high voltage power source is used. In that case, a problem of energy loss by the converter arises. For example, the conversion efficiency of a converter which converts voltage tends to be reduced with an increase in the difference between input voltage and output voltage. Specifically, when power supply voltage from a power line, which is approximately 100 V to 240 V, is reduced to the driving voltage of the organic EL element, which is approximately 3 V to several tens of volts, a problem that a large amount of energy is lost by the converter arises.

The present invention is made in view of the foregoing technical background. Therefore, an object of one embodiment of the present invention is to provide a light-emitting unit with a small energy loss. An object of one embodiment of the present invention is to provide a light-emitting unit with high reliability.

An object of one embodiment of the present invention is to provide a light-emitting device including a light-emitting unit with a small energy loss. An object of one embodiment of the present invention is to provide a light-emitting device including a light-emitting unit with high reliability.

An object of one embodiment of the present invention is to provide a lighting device including a light-emitting unit with a small energy loss. An object of one embodiment of the present invention is to provide a lighting device including a light-emitting unit with high reliability.

In order to drive an organic EL element with energy loss reduced as much as possible in the usage environment where high power supply voltage is supplied, the organic EL element may be driven at high power supply voltage without using a converter which causes the energy loss, or the high power supply voltage may be converted into power supply voltage at which the conversion efficiency of the converter is not impaired and the driving voltage of the organic EL element may be adjusted to the power supply voltage. Specifically, a light-emitting unit in which organic EL elements are connected in series to increase the driving voltage may be formed and may be connected to high power supply voltage through a converter.

However, in the light-emitting unit in which the plurality of organic EL elements are connected in series, the whole light-emitting unit is turned off when one of the connection portions of the organic EL elements is disconnected. In other words, the defect percentage of a lighting device including the light-emitting unit is the product of the defect percentage of the connection portions of the light-emitting elements; thus, an adverse effect of making it difficult for the lighting device to have reliability occurs.

In view of the above, the inventor focused on a portion, in a light-emitting unit in which a plurality of organic EL elements (hereinafter, simply referred to as a light-emitting element) are connected in series, where an upper electrode of the light-emitting element is connected to a lower electrode of the adjacent light-emitting element. The inventor has come up with a structure in which an insulating partition wall which covers an edge portion of a lower electrode (first electrode) of one of the light-emitting elements is provided, and an upper electrode (second electrode) of the one of the light-emitting elements intersects with the edge portion of the first electrode with the insulating partition wall interposed therebetween and is electrically connected to a lower electrode (third electrode) of the other light-emitting element, and has solved the problems.

In other words, one embodiment of the present invention is a light-emitting unit including a first light-emitting element and a second light-emitting element over an insulating surface. The first light-emitting element includes a first electrode, a second electrode, and a layer containing a light-emitting organic compound, which is interposed between the first electrode and the second electrode. An edge portion of the first electrode is covered with a first insulating partition wall. The second light-emitting element includes a third electrode, a fourth electrode, and a layer containing a light-emitting organic compound, which is interposed between the third electrode and the fourth electrode. The first electrode and the third electrode are formed from the same layer, which has a property of transmitting light emitted from the light-emitting organic compound. The second electrode and the fourth electrode are formed from the same layer. The second electrode intersects with the edge portion of the first electrode with the first partition wall interposed therebetween and is electrically connected to the third electrode.

According to the above embodiment of the present invention, in a region where the insulating partition wall is provided for the edge portion of the first electrode, the second electrode intersects with the edge portion of the first electrode with the partition wall interposed therebetween. In addition, the second electrode is electrically connected to the third electrode, which makes the first light-emitting element and the second light-emitting element connected in series. Thus, a light-emitting unit in which the first light-emitting element and the second light-emitting element are connected in series and the driving voltage is increased can be provided. A light-emitting unit with high reliability, in which a short circuit between the first electrode and the second electrode hardly occurs at a step portion formed at the edge portion of the first electrode can also be provided.

One embodiment of the present invention is a light-emitting unit including a first light-emitting element and a second light-emitting element over an insulating surface. The first light-emitting element includes a first electrode, a second electrode, and a layer containing a light-emitting organic compound, which is interposed between the first electrode and the second electrode. An edge portion of the first electrode is covered with a first insulating partition wall. The second light-emitting element includes a third electrode, a fourth electrode, and a layer containing a light-emitting organic compound, which is interposed between the third electrode and the fourth electrode. An edge portion of the third electrode is covered with a second insulating partition wall. The first electrode and the third electrode are formed from the same layer, which has a property of transmitting light emitted from the light-emitting organic compound. The second electrode and the fourth electrode are formed from the same layer. The first partition wall and the second partition wall are formed from the same layer. The second electrode intersects with the edge portion of the first electrode with the first partition wall interposed therebetween, intersects with the edge portion of the third electrode with the second partition wall interposed therebetween, and is electrically connected to the third electrode.

According to the above embodiment of the present invention, in a region where the insulating partition wall is provided for the edge portion of the first electrode, the second electrode intersects with the edge portion of the first electrode with the partition wall interposed therebetween. In addition, in a region where the insulating partition wall is provided for the edge portion of the third electrode, the second electrode intersects with the edge portion of the third electrode with the partition wall interposed therebetween. In addition, the second electrode is electrically connected to the third electrode, which makes the first light-emitting element and the second light-emitting element connected in series. Thus, a light-emitting unit in which the first light-emitting element and the second light-emitting element are connected in series and the driving voltage is increased can be provided. A light-emitting unit with high reliability can also be provided, in which a short circuit between the first electrode and the second electrode hardly occurs at a step portion formed at the edge portion of the first electrode and the second electrode is difficult to break at a step portion formed at the edge portion of the third electrode.

One embodiment of the present invention is a light-emitting unit including a first light-emitting element and a second light-emitting element over an insulating surface. The first light-emitting element includes a first electrode, a second electrode, and a layer containing a light-emitting organic compound, which is interposed between the first electrode and the second electrode. An edge portion of the first electrode overlaps with a first partition wall with the layer containing a light-emitting organic compound interposed therebetween. The second light-emitting element includes a third electrode, a fourth electrode, and a layer containing a light-emitting organic compound, which is interposed between the third electrode and the fourth electrode. An edge portion of the third electrode overlaps with a second partition wall with the layer containing a light-emitting organic compound interposed therebetween. The first electrode and the third electrode are formed from the same layer, which has a property of transmitting light emitted from the light-emitting organic compound. The second electrode and the fourth electrode are formed from the same layer. The first partition wall and the second partition wall are formed from the same layer formed of a composite material containing an organic compound and an electron acceptor or the same layer of an insulator. The second electrode intersects with the edge portion of the first electrode with the first partition wall interposed therebetween, intersects with the edge portion of the third electrode with the second partition wall interposed therebetween, and is electrically connected to the third electrode.

One embodiment of the present invention is a light-emitting unit including a first light-emitting element and a second light-emitting element over an insulating surface. The first light-emitting element includes a first electrode, a second electrode, and a layer containing a light-emitting organic compound, which is interposed between the first electrode and the second electrode. An edge portion of the first electrode is covered with a first partition wall. The second light-emitting element includes a third electrode, a fourth electrode, and a layer containing a light-emitting organic compound, which is interposed between the third electrode and the fourth electrode. An edge portion of the third electrode is covered with a second partition wall. The first electrode and the third electrode are formed from the same layer, which has a property of transmitting light emitted from the light-emitting organic compound. The second electrode and the fourth electrode are formed from the same layer. The first partition wall and the second partition wall are formed from the same layer formed of a composite material containing an organic compound and an electron acceptor. The second electrode intersects with the edge portion of the first electrode with the first partition wall interposed therebetween and is electrically connected to the third electrode.

According to the above embodiment of the present invention, in a region where the partition wall (also referred to as a composite material layer) formed of a composite material containing an organic compound and an electron acceptor is provided for the edge portion of the first electrode, the second electrode intersects with the edge portion of the first electrode with the partition wall interposed therebetween and is electrically connected to the third layer, so that the first light-emitting element and the second light-emitting element are connected in series. Thus, a light-emitting unit in which the first light-emitting element and the second light-emitting element are connected in series and the driving voltage is increased can be provided. A light-emitting unit with high reliability in which a short circuit between the first electrode and the second electrode hardly occurs at a step portion formed at the edge portion of the first electrode can also be provided. Moreover, the composite material layer is easily formed.

In the light-emitting unit according to one embodiment of the present invention, an edge portion of the second electrode overlaps with the layer containing a light-emitting organic compound of the second light-emitting element; an edge portion of the fourth electrode overlaps with the layer containing a light-emitting organic compound of the second light-emitting element; and the second electrode and the fourth electrode are electrically insulated from each other over the layer containing a light-emitting organic compound of the second light-emitting element.

According to the above embodiment of the present invention, the second electrode and the fourth electrode are electrically insulated from each other over the layer containing a light-emitting organic compound. By employing such a structure, even when a thin region is formed at an edge portion of the layer containing a light-emitting organic compound of the second light-emitting element in a step of forming the layer, the thin region overlaps with the second electrode which is connected to the third electrode. Thus, the thickness of the layer containing a light-emitting organic compound can be kept uniform between the third electrode and the fourth electrode. Consequently, a short circuit between the third electrode and the fourth electrode can be prevented and the reliability of the second light-emitting element can be improved.

In the light-emitting unit according to one embodiment of the present invention, the second light-emitting element is provided with an auxiliary wiring which is electrically connected to the third electrode, the auxiliary wiring contains a metal whose conductivity is higher than that of the third electrode, the auxiliary wiring is provided in contact with part of the third electrode, which is located on the outer side than the fourth electrode, and the auxiliary wiring is in contact with the second electrode, so that the second electrode and the third electrode are electrically connected to each other.

According to the above embodiment of the present invention, the second electrode and the third electrode are electrically connected through the auxiliary wiring containing a metal. In such a structure, light emitted from the light-emitting organic compound is not blocked, and the non-uniformity of the potential in the third electrode is reduced, so that the second light-emitting element can emit light uniformly. A bad connection at an interface between the second electrode and the third electrode which has a property of transmitting light emitted from the light-emitting organic compound can be prevented.

In the light-emitting unit according to one embodiment of the present invention, an insulating protective layer is provided over the third electrode in the second light-emitting element, the edge portion of the second electrode overlaps with the third electrode with the protective layer interposed therebetween, the edge portion of the fourth electrode overlaps with the third electrode with the protective layer interposed therebetween, and the second electrode and the fourth electrode are electrically insulated from each other over the protective layer.

According to the above embodiment of the present invention, the second electrode and the fourth electrode are electrically insulated from each other over the protective layer over the third electrode. The structure in which the protective layer is provided can prevent a defect of a short circuit between the second electrode and the fourth electrode due to damage to the first light-emitting element and the second light-emitting element in a step of forming the second electrode and the fourth electrode which are electrically insulated from each other.

In the light-emitting unit according to one embodiment of the present invention, a first sub wiring which is in contact with first electrode is provided in a position overlapping with the layer containing an organic compound and the second electrode of the first light-emitting element and/or a second sub wiring which is in contact with the third electrode is provided in a position overlapping with the layer containing an organic compound and the fourth electrode of the second light-emitting element. The first sub wiring contains a metal whose conductivity is higher than that of the first electrode and has a property of transmitting light emitted from the light-emitting organic compound. The second sub wiring contains a metal whose conductivity is higher than that of the third electrode and has a property of transmitting light emitted from the light-emitting organic compound.

According to the above embodiment of the present invention, the sub wiring which contains a metal whose conductivity is higher than that of the first electrode and/or the third electrode is provided in contact with the first electrode and/or the third electrode. Thus, the non-uniformity of the potential in the first electrode and/or the third electrode can be reduced, so that the first light-emitting element and/or the second light-emitting element can emit light uniformly.

One embodiment of the present invention is a light-emitting device which includes a converter and in which the light-emitting unit is driven with the output voltage of the converter.

According to the above embodiment of the present invention, a light-emitting device including a light-emitting unit with a small energy loss can be provided. A light-emitting device including a light-emitting unit with high reliability can be provided.

One embodiment of the present invention is a lighting device including the light-emitting unit.

According to the above embodiment of the present invention, a lighting device including a light-emitting unit with a small energy loss can be provided. A lighting device including a light-emitting unit with high reliability can be provided.

Note that in this specification, the first partition wall, the second partition wall, and the protective layer which are described above are collectively referred to as a partition wall in some cases.

According to one embodiment of the present invention, a light-emitting unit with a small energy loss can be provided. A light-emitting unit with high reliability can be provided.

A light-emitting device including a light-emitting unit with a small energy loss can be provided. A light-emitting device including a light-emitting unit with high reliability can be provided.

A lighting device including a light-emitting unit with a small energy loss can be provided. A lighting device including a light-emitting unit with high reliability can be provided.

BRIEF DESCRIPTION OF THE DRAWINGS

FIGS. 1A and 1B illustrate a light-emitting unit of one embodiment of the present invention.

FIGS. 4A and 4B illustrate a light-emitting unit of one embodiment of the present invention.

FIGS. 6A and 6B illustrate a light-emitting unit of one embodiment of the present invention.

FIGS. 12A to 12C illustrate a manufacturing method of a light-emitting unit of one embodiment of the present invention.

FIGS. 16A and 16B each illustrate a light-emitting device of one embodiment of the present invention.

BEST MODE FOR CARRYING OUT THE INVENTION

Figure 2A:
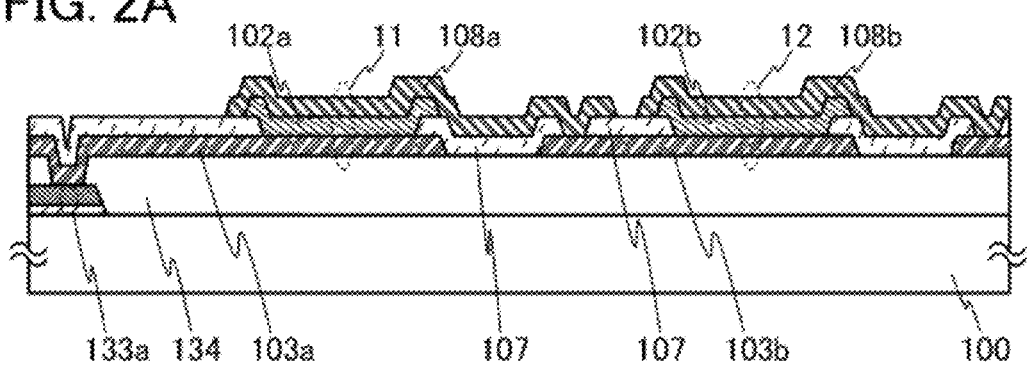
FIGS. 2A and 2B each illustrate a light-emitting unit of one embodiment of the present invention.

Embodiments will be described in detail with reference to the accompanying drawings. Note that the present invention is not limited to the following description and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and the description of such portions is not repeated.

Each of the light-emitting elements described in this specification has a bottom-emission structure. Therefore, the first electrode has a property of transmitting light emitted from the light-emitting organic compound.

(Embodiment 1)

Figure 14A:
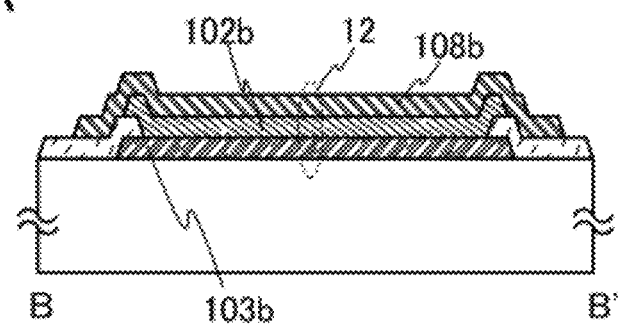
FIGS. 14A to 14C each illustrate a light-emitting unit of one embodiment of the present invention.

In this embodiment, light-emitting units each of which is one embodiment of the present invention will be described with reference to FIGS. 1A and 1B, FIGS. 2A and 2B, FIGS. 3A and 3B, and FIG. 14A. FIG. 1B is a cross-sectional view taken along line A-A' in FIG. 1A. FIG. 14A is a cross-sectional view taken along line B-B' in FIG. 1A.

<Structural Example>

First, structures of the light-emitting units described in this embodiment will be described.

Note that in this specification, light-emitting elements each include a lower electrode, an upper electrode, and a layer containing a light-emitting organic compound, which is interposed between the lower electrode and the upper electrode. An EL layer includes at least the layer containing a light-emitting organic compound. The EL layer can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like in addition to the layer containing a light-emitting organic compound are combined as appropriate.

<Structural Example 1>

A light-emitting unit illustrated in FIGS. 1A and 1B and FIG. 14A includes a wiring 133a, a wiring 133b, a planarization layer 134, a partition wall 107, a first light-emitting element 11, a second light-emitting element 12, and a third light-emitting element 13 over a substrate 100.

The first light-emitting element 11 includes a first electrode 103a formed over the planarization layer 134, an EL layer 102a formed over the first electrode 103a, and a second electrode 108a formed over the EL layer 102a.

The second light-emitting element 12 includes a first electrode 103b formed over the planarization layer 134, an EL layer 102b formed over the first electrode 103b, and a second electrode 108b formed over the EL layer 102b.

The third light-emitting element 13 includes a first electrode 103c formed over the planarization layer 134, an EL layer 102c formed over the first electrode 103c, and a second electrode 108c formed over the EL layer 102c.

The first electrode 103a in the first light-emitting element 11 is connected to the wiring 133a. The second electrode 108c in the third light-emitting element 13 is connected to the wiring 133b through an extraction electrode 160. The extraction electrode 160 is formed using the same material as the first electrode.

In Structural Example 1, the second electrode 108a intersects with an edge portion of the first electrode 103a with the insulating partition wall 107 interposed therebetween in a position where the partition wall 107 is provided for the edge portion of the first electrode 103a. The second electrode 108a intersects with an edge portion of the first electrode 103b with the insulating partition wall 107 interposed therebetween in a position where the partition wall 107 is provided for the edge portion of the first electrode 103b. The second electrode 108a and the first electrode 103b are directly connected to each other. Thus, the first light-emitting element 11 and the second light-emitting element 12 are connected in series. In a similar manner, the second electrode 108b and the first electrode 103c are directly connected to each other. Thus, the second light-emitting element 12 and the third light-emitting element 13 are connected in series.

Thus, the light-emitting unit in which the plurality of light-emitting elements are connected in series and the driving voltage is increased can be provided.

In Structural Example 1, the partition wall 107 is provided so that the partition wall 107 covers the edge portion of the first electrode 103a. Note that the partition wall 107 has an edge portion with a forward tapered shape. In a forward tapered shape, a layer gradually increases in thickness from its edge and is in contact with a layer serving as a base in a cross section. When the partition wall 107 has the forward tapered shape, a film formed over the partition wall 107 can be prevented from being broken. Thus, a light-emitting unit with high reliability, in which a short circuit between the first electrode 103a and the second electrode 108a hardly occurs at a step portion formed at the edge portion of the first electrode 103a can be provided.

Further, in Structural Example 1, the partition wall 107 is provided so that the partition wall 107 covers the edge portion of the first electrode 103b. Thus, a light-emitting unit with high reliability, in which the second electrode 108a is difficult to break at a step portion formed at the edge portion of the first electrode 103b, can be provided.

According to one embodiment of the present invention, the light-emitting unit includes the partition wall 107, and thus is a highly reliable light-emitting element in which a short circuit between the first electrode and the second electrode hardly occurs at a step portion of the edge portion of the first electrode.

It is preferable that a sealing film which covers the top surface of the light-emitting element be provided in order to improve the reliability. Alternatively, a base film may be provided over the substrate. The sealing film and the base film have a function of protecting the light-emitting element from external water or the like. By providing the sealing film or the base film, the deterioration of the light-emitting element can be reduced; thus, the durability and lifetime of the light-emitting unit can be improved.

The sealing film is preferably a film having transmittance less than or equal to $10^{-6}$ g/m$^2$·day and a gas barrier property, for example. A stacked-layer structure in which at least one layer containing an inorganic material is interposed between layers containing an organic material can be used for the sealing film, for example. As the layer containing an organic material, an adhesive layer such as an epoxy-based adhesive layer can be given as an example. As the layer containing an inorganic material, a film with a barrier property, such as a silicon oxide film or a silicon nitride film can be given as an example.

Specifically, a thermosetting resin (e.g., an epoxy-based adhesive) is applied to a film to be a supporting body to a thickness of several tens of micrometers and dried, and an inorganic film (e.g., a silicon oxide film) is formed to a thickness of several micrometers thereover to form a first member; thermosetting epoxy resin is applied to a mold release film and dried to form a second member; and the first member and the second member are bonded to each other, so that a stack is formed. Next, a surface of the stack from which the mold release film is removed is bonded to a top surface of the above-described light-emitting element so as to face each other, thermocompression is performed, and then the epoxy resin may be cured by heat. With such a structure, the deterioration of the light-emitting element is suppressed and the durability and lifetime of the light-emitting unit can be improved.

In the second light-emitting element 12 illustrated in FIG. 1B, one edge portion of the EL layer 102b is located over the first electrode 103b and the other edge portion is located over the partition wall 107. Moreover, one edge portion of the second electrode 108b is located over the EL layer 102b and the other edge portion is located over the first electrode 103c of the third light-emitting element 13. However, the structure of one embodiment of the present invention is not limited thereto.

For example, as in the first light-emitting element 11 illustrated in FIG. 2A, both edge portions of the EL layer 102a may be located over the partition wall 107 and both edge portions of the second electrode 108b may also be located over the partition wall 107.

<Structural Example 2>

Specifically, a light-emitting unit illustrated in FIG. 2A includes the wiring 133a, the planarization layer 134, the first light-emitting element 11, and the second light-emitting element 12 over the substrate 100.

Each of the light-emitting elements includes a first electrode formed over the planarization layer 134, an EL layer formed over the first electrode, and a second electrode formed over the EL layer.

The first electrode 103a in the first light-emitting element 11 is connected to the wiring 133a.

In Structural Example 2, the second electrode 108a intersects with an edge portion of the first electrode 103a with the insulating partition wall 107 interposed therebetween in a position where the partition wall 107 is provided for the edge portion of the first electrode 103a. The second electrode 108a intersects with an edge portion of the first electrode 103b with the insulating partition wall 107 interposed therebetween in a position where the partition wall 107 is provided for the edge portion of the first electrode 103b. The second electrode 108a and the first electrode 103b are directly connected to each other. Consequently, the first light-emitting element 11 and the second light-emitting element 12 are connected in series.

Thus, the light-emitting unit in which the plurality of light-emitting elements are connected in series and the driving voltage is increased can be provided.

In Structural Example 2, the partition wall 107 is provided so that the partition wall 107 covers the edge portion of the first electrode 103a. This makes it possible to provide a light-emitting unit with high reliability, in which a short circuit between the first electrode 103a and the second electrode 108a hardly occurs at a step portion formed at the edge portion of the first electrode 103a.

Moreover, in Structural Example 2, the partition wall 107 is provided so that the partition wall 107 covers the edge portion of the first electrode 103b. This makes it possible to provide a light-emitting unit with high reliability, in which the second electrode 108a is difficult to break at a step portion formed at the edge portion of the first electrode 103b.

The partition wall 107 includes a region where the partition wall 107 is provided so that the partition wall 107 covers the edge portion of the first electrode 103a and the edge portion of the first electrode 103b and a region where the partition wall 107 is provided over the first electrode 103b (the region is also referred to as a protective layer).

In Structural Example 2, an edge portion of the second electrode 108a overlaps with the first electrode 103b with the protective layer (here, part of the partition wall 107) over the first electrode 103b interposed therebetween, and an edge portion of the second electrode 108b overlaps with the first electrode 103b with the protective layer interposed therebetween. In Structural Example 2, the second electrode 108a and the second electrode 108b are electrically insulated from each other over the protective layer. The structure in which the protective layer is provided can prevent a short circuit between the second electrode 108a and the second electrode 108b which are electrically insulated from each other due to damage to the first light-emitting element 11 and the second light-emitting element 12 in a step of forming the second electrode 108a and the second electrode 108b.

<Structural Example 3>

Figure 2B:
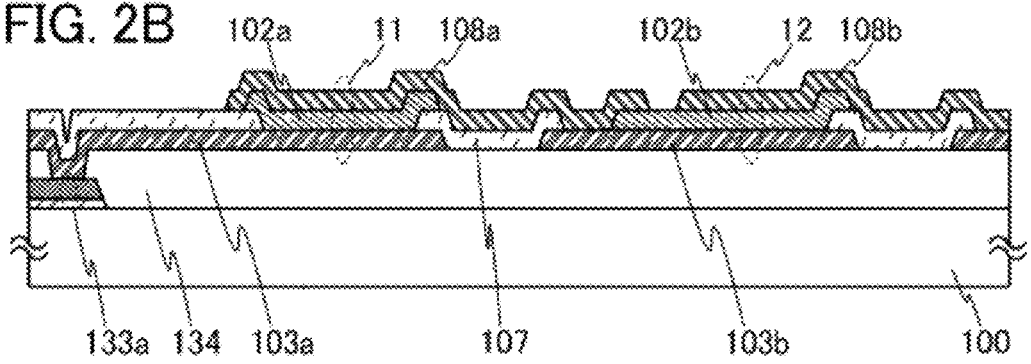

A light-emitting unit illustrated in FIG. 2B includes the wiring 133a, the planarization layer 134, the first light-emitting element 11, and the second light-emitting element 12 over the substrate 100.

Each of the light-emitting elements includes a first electrode formed over the planarization layer 134, an EL layer formed over the first electrode, and a second electrode formed over the EL layer.

The first electrode 103a in the first light-emitting element 11 is connected to the wiring 133a.

In Structural Example 3, the second electrode 108a intersects with an edge portion of the first electrode 103a with the insulating partition wall 107 interposed therebetween in a position where the partition wall 107 is provided for the edge portion of the first electrode 103a. The second electrode 108a intersects with an edge portion of the first electrode 103b with the insulating partition wall 107 interposed therebetween in a position where the partition wall 107 is provided for the edge portion of the first electrode 103b. The second electrode 108a and the first electrode 103b are directly connected to each other. Thus, the first light-emitting element 11 and the second light-emitting element 12 are connected in series.

Thus, the light-emitting unit in which the first light-emitting element 11 and the second light-emitting element 12 are connected in series and the driving voltage is increased can be provided.

The partition wall 107 is provided so that the partition wall 107 covers the edge portion of the first electrode 103a and the edge portion of the first electrode 103b. This makes it possible to provide a light-emitting unit with high reliability, in which a short circuit between the first electrode 103a and the second electrode 108a hardly occurs at a step portion formed at the edge portion of the first electrode 103a and the second electrode 108a is difficult to break at a step portion formed at the edge portion of the first electrode 103b.

In Structural Example 3, the edge portion of the second electrode 108a overlaps with the EL layer 102b and an edge portion of the second electrode 108b overlaps with the EL layer 102b. In Structural Example 3, the second electrode 108a and the second electrode 108b are electrically insulated from each other over the EL layer 102b. By employing such a structure, even when a thin region is formed at an edge portion of the EL layer 102b (specifically, the edge portion on the first light-emitting element 11 side) in a step of forming the EL layer 102b of the second light-emitting element 12 with a metal mask, the region overlaps with the second electrode 108a connected to the first electrode 103b. Thus, the thickness of the EL layer can be kept uniform between the first electrode 103b and the second electrode 108b. Thus, a short circuit between the first electrode 103b and the second electrode 108b can be prevented, and the reliability of the second light-emitting element 12 can be improved.

Note that although the edge portion of the EL layer is located over the partition wall (this structure is obtained by forming the EL layer after forming the partition wall) in each of Structural Examples 1 to 3, the partition wall can be formed over the EL layer in one embodiment of the present invention.

<Structural Example 4>

Figure 3A:
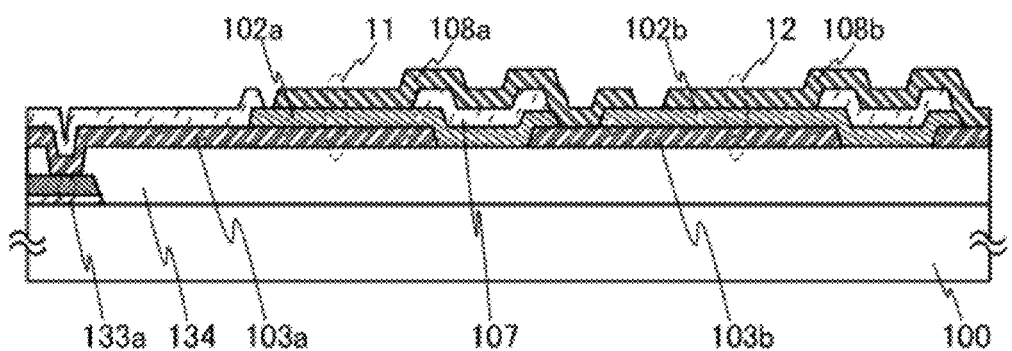
FIGS. 3A and 3B each illustrate a light-emitting unit of one embodiment of the present invention.

A light-emitting unit illustrated in FIG. 3A includes the wiring 133a, the planarization layer 134, the first light-emitting element 11, and the second light-emitting element 12 over the substrate 100.

Each of the light-emitting elements includes a first electrode formed over the planarization layer 134, an EL layer formed over the first electrode, and a second electrode formed over the EL layer.

The first electrode 103a in the first light-emitting element 11 is connected to the wiring 133a.

In Structural Example 4, the second electrode 108a intersects with an edge portion of the first electrode 103a with the EL layer 102a and the insulating partition wall 107 interposed therebetween in a position where the EL layer 102a and the partition wall 107 are provided for the edge portion of the first electrode 103a. The second electrode 108a intersects with an edge portion of the first electrode 103b with the EL layer 102a and the insulating partition wall 107 interposed therebetween in a position where the EL layer 102a and the partition wall 107 are provided for the edge portion of the first electrode 103b. The second electrode 108a and the first electrode 103b are directly connected to each other. Thus, the first light-emitting element 11 and the second light-emitting element 12 are connected in series.

Thus, the light-emitting unit in which the first light-emitting element 11 and the second light-emitting element 12 are connected in series and the driving voltage is increased can be provided.

The partition wall 107 is provided so that the partition wall 107 covers the edge portion of the first electrode 103a and the edge portion of the first electrode 103b. This makes it possible to provide a light-emitting unit with high reliability, in which a short circuit between the first electrode 103a and the second electrode 108a hardly occurs at a step portion formed at the edge portion of the first electrode 103a and the second electrode 108a is difficult to break at a step portion formed at the edge portion of the first electrode 103b.

In Structural Example 4, the edge portion of the second electrode 108a overlaps with the EL layer 102b and an edge portion of the second electrode 108b overlaps with the EL layer 102b. In Structural Example 4, the second electrode 108a and the second electrode 108b are electrically insulated from each other over the EL layer 102b. By employing such a structure, even when a thin region is formed at an edge portion of the EL layer 102b in a step of forming the EL layer 102b of the second light-emitting element 12, the region overlaps with the second electrode 108a connected to the first electrode 103b. Thus, the thickness of the EL layer can be kept uniform between the first electrode 103b and the second electrode 108b. Consequently, a short circuit between the first electrode 103b and the second electrode 108b can be prevented, and the reliability of the second light-emitting element 12 can be improved.

The partition wall 107 is provided in Structural Example 4; thus, a light-emitting unit with high reliability, in which a short circuit between the first electrode and the second electrode hardly occurs at a step portion formed at the edge portion of the first electrode can be provided.

In FIG. 3A, one edge portion of the EL layer 102a is located over the first electrode 103a and the other edge portion is located over the first electrode 103b.

Figure 3B:
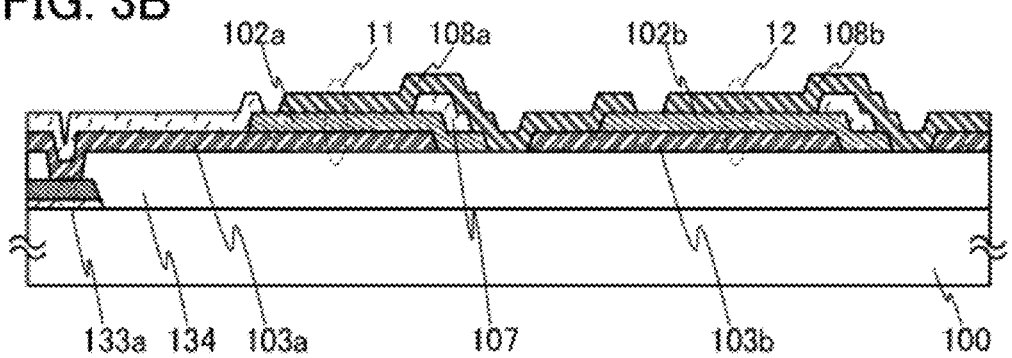

In FIG. 3A, the EL layer 102a is provided so that the EL layer 102a covers the edge portion of the first electrode 103a and the edge portion of the first electrode 103b. This makes it possible to provide a light-emitting unit with high reliability, in which a short circuit between the first electrode 103a and the second electrode 108a hardly occurs at a step portion formed at the edge portion of the first electrode 103a and the second electrode 108a is difficult to break at a step portion formed at the edge portion of the first electrode 103b. Such a structure is preferable for a structure of one embodiment of the present invention; however, the structure of one embodiment of the present invention is not limited thereto. For example, as illustrated in FIG. 3B, one edge portion of the EL layer 102a may be located over the first electrode 103a and the other edge portion is located over the substrate 100.

<Material>

Examples of materials which can be used for each layer will be described below.

[Substrate]

As the material of the substrate 100, a material with a light-transmitting property, such as glass, quartz, or an organic resin can be used.

In the case where an organic resin is used for the substrate 100, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

[Sealing Film and Base Film]

The sealing film can be formed using a material with a barrier property. The base film can be formed using an inorganic material with a light-transmitting property and a barrier property. In the case where an organic resin is used for a substrate, for example, a glass layer with a thickness greater than or equal to 25 μm and less than or equal to 100 μm may be used. The thickness of the glass layer is typically greater than or equal to 45 μm and less than or equal to 80 μm. By combining an organic resin substrate and a glass layer, moisture, an impurity, or the like can be prevented from entering an organic compound or a metal material included in the light-emitting element from the outside of the light-emitting unit, and the weight of the light-emitting unit can be reduced.

[Light-Emitting Element]

As a light-transmitting material for the first electrode, indium oxide, indium tin oxide (ITO), indium zinc oxide, zinc oxide, zinc oxide to which gallium is added, or the like can be used.

The thickness of the first electrode is greater than or equal to 50 nm and less than or equal to 300 nm, typically greater than or equal to 100 nm and less than or equal to 120 nm.

In addition, for the first electrode, a metal material such as gold, platinum, nickel, tungsten, chromium, molybdenum, iron, cobalt, copper, palladium, or titanium can be used. A nitride of the metal material (e.g., titanium nitride) or the like may also be used. Graphene or the like may also be used. In the case of using the metal material (or the nitride thereof), the first electrode may be thinned so as to be able to transmit light.

Examples of structures of the EL layer will be described in detail in Embodiment 8.

The second electrode is provided on the side opposite to the side where light is extracted and is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

[Wiring]

For the wiring, a single layer or a stacked layer using a material selected from copper (Cu), titanium (Ti), tantalum (Ta), tungsten (W), molybdenum (Mo), chromium (Cr), neodymium (Nd), scandium (Sc), and nickel (Ni) or an alloy material including any of these materials as its main component can be used. Aluminum can also be used for the material of the wiring; however, in that case, the wiring might be corroded when the wiring is provided to be in direct contact with ITO or the like. Therefore, it is preferable that the wiring have a stacked structure and aluminum be used in a layer which is not in contact with ITO or the like.

The wiring of this embodiment includes a stacked layer in which a copper film is formed over a titanium film. Copper can be preferably used because of its low resistance. The thickness of the wiring is preferably greater than or equal to 2 μm and less than or equal to 35 μm.

[Planarization Layer]

The planarization layer 134 can be formed using an inorganic insulating material or an organic insulating material. Note that the planarization layer 134 formed using a heat-resistant organic insulating material such as an acrylic resin, a polyimide, a benzocyclobutene-based resin, a polyamide, or an epoxy resin is preferably used as a planarization insulating film. Other than such organic insulating materials, it is possible to use a low-dielectric constant material (a low-k material), a siloxane based resin, phosphosilicate glass (PSG), borophosphosilicate glass (BPSG), or the like. Note that the planarization layer 134 may be formed by stacking a plurality of insulating films formed using any of these materials.

A method for forming the planarization layer 134 is not particularly limited, and a sputtering method, a spin coat method, a dipping method, a printing method, an inkjet method, or the like can be used depending on the material.

[Partition Wall]

As a material of the partition wall, for example, an organic resin such as polyimide, acrylic, polyamide, or epoxy or an inorganic insulating material can be used.

The angle of a side wall surface of a layer whose edge portion with a forward tapered shape is in contact with a layer to be a base is greater than or equal to 10° and less than or equal to 85°, preferably greater than or equal to 60° and less than or equal to 80°.

It is particularly preferable that the partition wall be formed using a photosensitive resin material to have an opening over the first electrode so that a sidewall of the opening is formed as an inclined surface with continuous curvature. Specifically, the radius of curvature of a curve drawn by a cross section of an insulating film is desirably approximately 0.2 μm to 2 μm.

There is no particular limitation on the method for forming the partition wall. A photolithography method, a sputtering method, an evaporation method, a droplet discharging method (e.g., an inkjet method), a printing method (e.g., a screen printing method or an offset printing method), or the like may be used.

The thickness of the partition wall may be for example, greater than or equal to 20 nm and less than or equal to 20 μm, preferably greater than or equal to 20 nm and less than or equal to 200 nm.

A composite material containing an organic compound and an electron acceptor (acceptor) may also be used in Structural Example 4.

As the organic compound for the composite material, a variety of compounds such as an aromatic amine compound, a carbazole derivative, aromatic hydrocarbon, and a high molecular compound (e.g., an oligomer, a dendrimer, or a polymer) can be used.

Examples of the organic compound that can be used for the composite material include aromatic amine compounds such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)-amino]-9-phenylcarbazole (abbreviation: PCzPCN1), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)-phenyl]-2,3,5,6-tetraphenylbenzene.

Other examples the organic compound include aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples the organic compound include aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Examples of the electron acceptor include organic compounds such as 7,7,8,8-tetracyano-2,3,5,6-tetrafluoroquinodimethane (abbreviation: F$_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is particularly preferable because it is stable in the air, has a low hygroscopic property, and is easily handled.

Note that the composite material may be formed using any of the above electron acceptors and a high-molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD).

<Manufacturing Method>

Figure 11A:
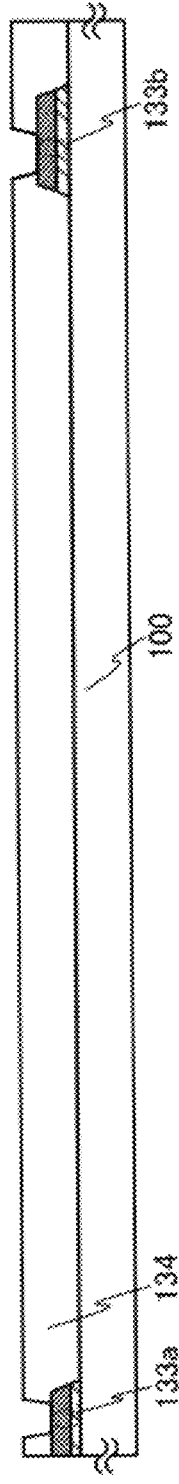
FIGS. 11A to 11C illustrate a manufacturing method of a light-emitting unit of one embodiment of the present invention.

Manufacturing methods of Structural Examples 1 to 4 described in this embodiment will be described with reference to FIGS. 11A to 11C.

<Structural Example>(FIGS. 1A and 1B and FIG. 14A)

First, the wiring 133a and the wiring 133b are formed over the substrate 100. A conductive film for forming the wiring 133a and the wiring 133b is formed, and then the conductive film can be patterned by a known pattern forming method.

Next, the planarization layer 134 which covers the substrate 100, the wiring 133a, and the wiring 133b is formed. There is no particular limitation on the method for forming the planarization layer 134. The planarization layer 134 can be formed, depending on the material, by a method such as a sputtering method, an SOG method, a spin coating method, a dipping method, a spray coating method, a droplet discharge method (e.g., an inkjet method), a printing method (e.g., screen printing or offset printing), or with a tool (equipment) such as a doctor knife, a roll coater, a curtain coater, or a knife coater. After that, openings reaching the wiring 133a and the wiring 133b are formed (FIG. 11A).

Next, a conductive film which is in contact with the wiring 133a and the wiring 133b through the openings is formed, and then the conductive film is patterned by a known pattern forming method, so that the first electrodes 103a to 103c and the extraction electrode 160 are formed.

Figure 11B:
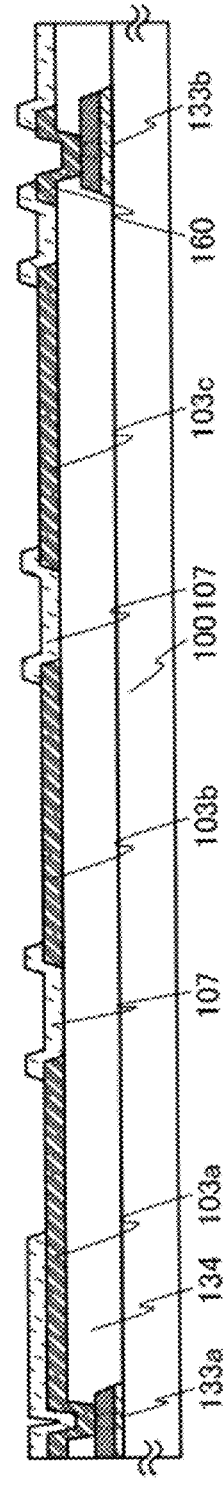

After that, the partition wall 107 which covers edge portions of the first electrodes 103a to 103c and fills gaps between the first electrodes 103a, 103b, and 103c is formed (FIG. 11B).

It is preferable that the upper edge portion of the partition wall 107 have a curvature so that the EL layer and the second electrode which are formed later can be prevented from being broken. The upper edge portion of the partition wall 107 has a curvature, whereby the step coverage with the EL layer and the second electrode can be favorable and the EL layer and the second electrode which are formed later can have an extremely small thickness.

Next, the EL layers 102a to 102c are formed. These EL layers can be formed using structures and methods which are given as examples in a later embodiment as appropriate.

Figure 11C:
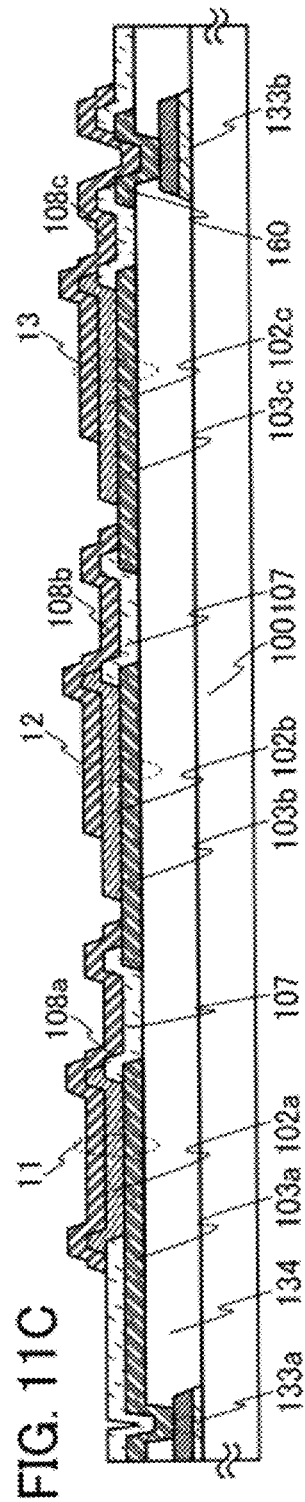

Lastly, the second electrodes 108a to 108c are formed (FIG. 11C). The second electrodes can be formed by, for example, an evaporation method, a sputtering method, or the like using a metal mask.

Through the above steps, Structural Example 1 can be formed.

Most of the manufacturing method of Structural Example 1 can be applied to manufacturing methods of Structural Examples 2 to 4. Differences in the manufacturing method between Structural Example 1 and Structural Examples 2 to 4 will be described below.

<Structural Example 2>

In order to obtain the structure (FIG. 2A) described in Structural Example 2, the partition wall 107 may also be formed over the first electrode in a step of forming the partition wall 107. In addition, the second electrode may be formed so that the edge portion of the second electrode overlaps with the first electrode with the partition wall 107 over the first electrode interposed therebetween.

<Structural Example 3>

In order to obtain the structure (FIG. 2B) described in Structural Example 3, the second electrode may be formed so that the edge portion of the second electrode is in contact with an upper portion of the EL layer of the adjacent light-emitting element (specifically, the light-emitting element including the first electrode to which the second electrode is directly connected).

<Structural Example 4>

In order to obtain the structures (FIGS. 3A and 3B) described in Structural Example 4, the EL layer may be formed before the partition wall 107 is formed. In addition, the second electrode may be formed so that the edge portion of the second electrode is in contact with an upper portion of the EL layer of the adjacent light-emitting element (specifically, the light-emitting element including the first electrode to which the second electrode is directly in contact).

Each of the light-emitting units described in this embodiment includes the partition wall 107, and thus is a highly reliable light-emitting unit in which a short circuit between the first electrode and the second electrode hardly occurs at a step portion at the edge portion of the first electrode.

This embodiment can be freely combined with any of the other embodiments.

(Embodiment 2)

Figure 14B:
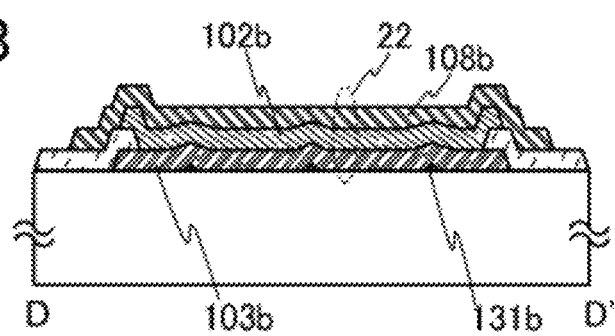

In this embodiment, light-emitting units each of which is one embodiment of the present invention will be described with reference to FIGS. 4A and 4B, FIGS. 5A to 5C, and FIG. 14B. FIG. 4B is a cross-sectional view taken along line C-C' in FIG. 4A. FIG. 14B is a cross-sectional view taken along line D-D' in FIG. 4A.

A sub wiring illustrated in FIG. 4A is formed in a comb shape. However, the shape of the sub wiring is not limited thereto.

In each of the light-emitting units described in this embodiment, a sub wiring is provided in contact with a first electrode. When the sub wiring is provided, a voltage drop due to the resistance of the first electrode can be suppressed. In the light-emitting units described in this embodiment, the sub wiring is provided so that the sub wiring overlaps with an EL layer and a second electrode. The sub wiring contains a metal whose conductivity is higher than that of the first electrode. In addition, the sub wiring has a property of transmitting light emitted from a light-emitting organic compound.

<Structural Example>

First, structures of the light-emitting units in this embodiment will be described.

<Structural Example 5>

A light-emitting unit illustrated in FIGS. 4A and 4B and FIG. 14B includes the wiring 133*a*, the wiring 133*b*, the planarization layer 134, a first light-emitting element 21, a second light-emitting element 22, and a third light-emitting element 23 over the substrate 100.

Each of the light-emitting elements includes a sub wiring formed over the planarization layer 134, a first electrode formed over the sub wiring, an EL layer formed over the first electrode, and a second electrode formed over the EL layer.

A sub wiring 131*a* in the first light-emitting element 21 is connected to the wiring 133*a*. A second electrode 108*c* in the third light-emitting element 23 is connected to the wiring 133*b* through an extraction electrode 161 and an extraction electrode 162. The extraction electrode 161 is formed using the same material as the sub wiring. The extraction electrode 162 is formed using the same material as the first electrode.

In Structural Example 5, an edge portion of the first electrode 103*a* and an edge portion of the sub wiring 131*a* intersect with the second electrode 108*a* in a position where the insulating partition wall 107 is provided for the edge portion of the first electrode 103*a* and the edge portion of the sub wiring 131*a*. The second electrode 108*a* and the sub wiring 131*b* are directly connected to each other. The sub wiring 131*b* and the first electrode 103*b* are directly connected to each other. Thus, the second electrode 108*a* and the first electrode 103*b* are electrically connected to each other. Consequently, the first light-emitting element 21 and the second light-emitting element 22 are connected in series.

The second electrode 108*b* and the sub wiring 131*c* are directly connected to each other. The sub wiring 131*c* and the first electrode 103*c* are directly connected to each other. Thus, the second electrode 108*b* and the first electrode 103*c* are electrically connected to each other. Consequently, the second light-emitting element 22 and the third light-emitting element 23 are connected in series.

Thus, the light-emitting unit in which the plurality of light-emitting elements are connected in series and the driving voltage is increased can be provided.

In Structural Example 5, the partition wall 107 is provided so that the partition wall 107 covers the edge portion of the first electrode 103*a* and the edge portion of the sub wiring 131*a*. This makes it possible to provide a light-emitting unit with high reliability, in which a short circuit between the first electrode 103*a* and the second electrode 108*a* hardly occurs at a step portion formed at the edge portion of the first electrode 103*a* and the edge portion of the sub wiring 131*a*. Moreover, in Structural Example 5, the partition wall 107 is provided so that the partition wall 107 covers an edge portion of the sub wiring 131*b*.

When a conductive oxide is used as a light-transmitting material used for the first electrode, an insulating oxide film is formed at an interface between the first electrode and the second electrode in some cases depending on the combination with a metal used for the second electrode. The formation of the insulating oxide film causes an increase in electrical resistance, which results in an increase in the power consumption of the light-emitting unit.

In FIG. 4B, however, the first electrode and the second electrode are electrically connected to each other through the sub wiring. Thus, the formation of an insulating oxide film and an increase in electrical resistance can be suppressed by an appropriate selection of the material of the sub wiring.

Note that an edge portion of the EL layer might be thin when the EL layer is formed with a metal mask. For that reason, it is preferable to form a sufficiently wide EL layer. As illustrated in FIG. 4B, the EL layer 102*b* may cover an edge portion of the first electrode 103*b* as a result of forming a sufficiently wide EL layer. In that case, an edge portion of the second electrode 108*a* may be located over the EL layer 102*b* as long as at least part of the second electrode 108*a* is in contact with the sub wiring 131*b*. Needless to say, the edge portion of the EL layer 102*b* may be located over the first electrode 103*b*. This can be applied not only to the first light-emitting element 21 and the second light-emitting element 22 but also to the second light-emitting element 22 and the third light-emitting element 23.

The second light-emitting element 22 illustrated in FIG. 4B has a structure in which one edge portion of the EL layer 102*b* covers the first electrode 103*b* and the other edge portion is located over the partition wall 107. Moreover, one edge portion of the second electrode 108*b* is located over the EL layer 102*b* and the other edge portion is located over the sub wiring 131*c*. However, one embodiment of the present invention is not limited to the structure.

Figure 5A:
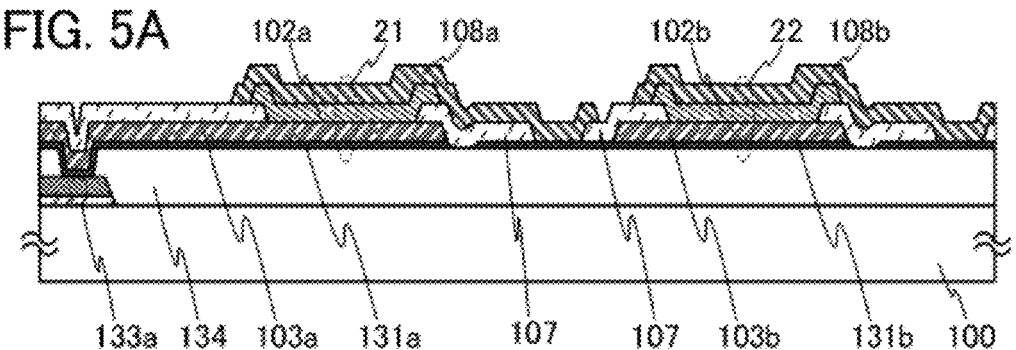
FIGS. 5A to 5C each illustrate a light-emitting unit of one embodiment of the present invention.

For example, as in the first light-emitting element 21 illustrated in FIG. 5A, both edge portions of the EL layer 102*a* may be located over the partition wall 107 and both edge portions of the second electrode 108*a* may also be located over the partition wall 107.

<Structural Example 6>

Specifically, a light-emitting unit illustrated in FIG. 5A includes the wiring 133*a*, the planarization layer 134, the first light-emitting element 21, and the second light-emitting element 22 over the substrate 100.

Each of the light-emitting elements includes a sub wiring formed over the planarization layer 134, a first electrode formed over the sub wiring, an EL layer formed over the first electrode, and a second electrode formed over the EL layer.

The sub wiring 131a in the first light-emitting element 21 is connected to the wiring 133a.

In Structural Example 6, an edge portion of the first electrode 103a and an edge portion of the sub wiring 131a intersect with the second electrode 108a in a position where the partition wall 107 is provided for the edge portion of the first electrode 103a and the edge portion of the sub wiring 131a. The second electrode 108a and the sub wiring 131b are directly connected to each other. The sub wiring 131b and the first electrode 103b are directly connected to each other. Thus, the second electrode 108a and the first electrode 103b are electrically connected to each other. Consequently, the first light-emitting element 21 and the second light-emitting element 22 are connected in series.

Thus, the light-emitting unit in which the first light-emitting element 21 and the second light-emitting element 22 are connected in series and the driving voltage is increased can be provided.

In FIG. 5A, the first electrode and the second electrode are electrically connected to each other through the sub wiring. Thus, as in Structural Example 5, the formation of an insulating oxide film and an increase in electrical resistance can be suppressed by an appropriate selection of the material of the sub wiring.

The partition wall 107 includes a region where the partition wall 107 covers the edge portion of the sub wiring 131a, the edge portion of the first electrode 103a, and an edge portion of the sub wiring 131b, and a region where the partition wall 107 is provided over the sub wiring 131b and the first electrode 103b. This makes it possible to provide a light-emitting unit with high reliability, in which a short circuit between the first electrode 103a and the second electrode 108a hardly occurs at a step portion formed at the edge portion of the first electrode 103a and the second electrode 108a is difficult to break at a step portion formed at the edge portion of the first electrode 103b.

In Structural Example 6, the second electrode 108a and the second electrode 108b are electrically insulated from each other over a protective layer (here, part of the partition wall 107) over the first electrode 103b and the sub wiring 131b. The structure in which the protective layer is provided can prevent a short circuit between the second electrode 108a and the second electrode 108b which are electrically insulated from each other due to damage to the first light-emitting element 21 and the second light-emitting element 22 in a step of forming the second electrode 108a and the second electrode 108b.

Although the first electrode is provided over the sub wiring in FIGS. 4A and 4B and FIG. 5A, the sub wiring can be provided over the first electrode in one embodiment of the present invention.

<Structural Example 7>

Figure 5B:
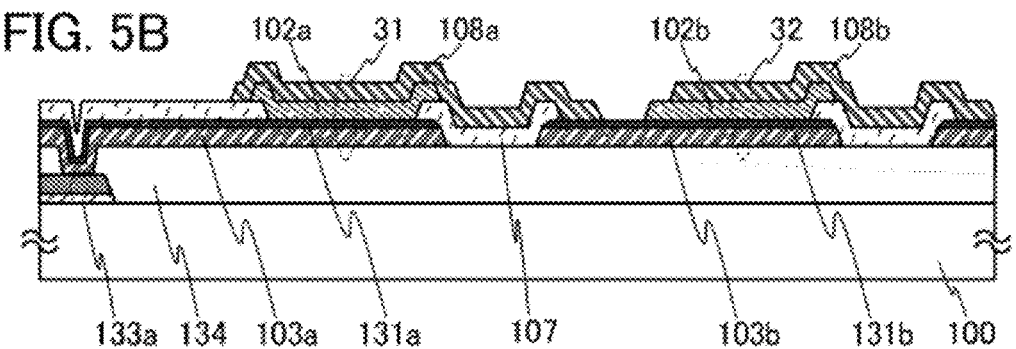

A light-emitting unit illustrated in FIG. 5B includes the wiring 133a, the planarization layer 134, a first light-emitting element 31, and a second light-emitting element 32 over the substrate 100.

Each of the light-emitting elements includes a first electrode formed over the planarization layer 134, a sub wiring formed over the first electrode, an EL layer formed over the sub wiring, and a second electrode formed over the EL layer.

The first electrode 103a in the first light-emitting element 31 is connected to the wiring 133a.

In Structural Example 7, an edge portion of the first electrode 103a and an edge portion of the sub wiring 131a intersect with an edge portion of the second electrode 108a in a position where the insulating partition wall 107 is provided for the edge portion of the first electrode 103a and the edge portion of the sub wiring 131a. The second electrode 108a intersects with an edge portion of the first electrode 103b and an edge portion of the sub wiring 131b with the insulating partition wall 107 interposed therebetween in a position where the partition wall 107 is provided for an edge portion of the first electrode 103b and an edge portion of the sub wiring 131b. The second electrode 108a and the sub wiring 131b are directly connected to each other. The sub wiring 131b and the first electrode 103b are directly connected to each other. Thus, the second electrode 108a and the first electrode 103b are electrically connected to each other. Consequently, the first light-emitting element 31 and the second light-emitting element 32 are connected in series.

Thus, the light-emitting unit in which the first light-emitting element 31 and the second light-emitting element 32 are connected in series and the driving voltage is increased can be provided.

In FIG. 5B, as in Structural Examples 5 and 6, the first electrode and the second electrode are electrically connected to each other through the sub wiring. Thus, the formation of an insulating oxide film and an increase in electrical resistance can be suppressed by an appropriate selection of the material of the sub wiring.

The partition wall 107 is provided so that the partition wall 107 covers the edge portion of the first electrode 103a, the edge portion of the sub wiring 131a, the edge portion of the sub wiring 131b, and the edge portion of the first electrode 103b. This makes it possible to provide a light-emitting unit with high reliability, in which a short circuit between the first electrode 103a and the second electrode 108a hardly occurs at a step portion formed at the edge portion of the first electrode 103a and the edge portion of the sub wiring 131a and the second electrode 108a is difficult to break at a step portion formed at the edge portion of the first electrode 103b and the edge portion of the sub wiring 131b.

Note that an edge portion of the EL layer might be thin when the EL layer is formed with a metal mask. For that reason, it is preferable to form a sufficiently wide EL layer. The edge portion of the second electrode 108a may be located over the EL layer 102b as a result of forming a sufficiently wide EL layer as long as at least part of the second electrode 108a is in contact with the sub wiring 131b.

The second light-emitting element 32 illustrated in FIG. 5B has a structure in which one edge portion of the EL layer 102b is located over the sub wiring 131b and the other edge portion is located over the partition wall 107. The second light-emitting element 32 also has a structure in which one edge portion of the second electrode 108b is located over the EL layer 102b and the other edge portion is located over the sub wiring. However, one embodiment of the present invention is not limited to the structures.

Figure 5C:
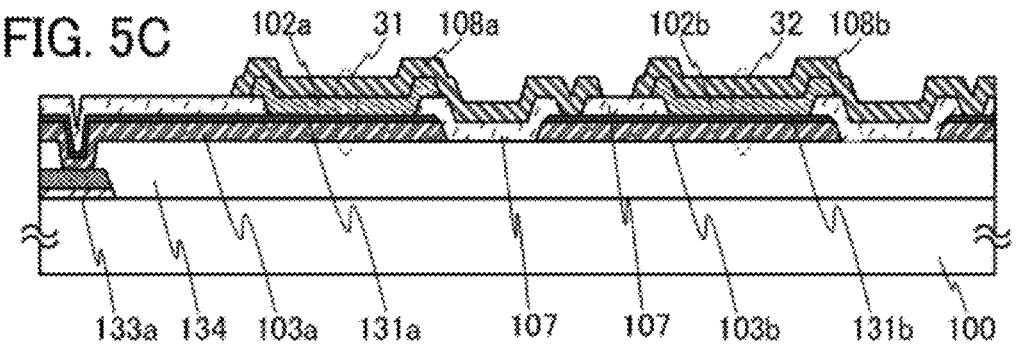

For example, as in the second light-emitting element 32 illustrated in FIG. 5C, both edge portions of the EL layer 102b may be located over the partition wall 107 and both edge portions of the second electrode 108b may also be located over the partition wall 107.

<Structural Example 8>

Specifically, a light-emitting unit illustrated in FIG. 5C includes the wiring 133a, the planarization layer 134, the first light-emitting element 31, and the second light-emitting element 32 over the substrate 100.

Each of the light-emitting elements includes a first electrode formed over the planarization layer 134, a sub wiring formed over the first electrode, an EL layer formed over the sub wiring, and a second electrode formed over the EL layer.

The first electrode 103a in the first light-emitting element 31 is connected to the wiring 133a.

In Structural Example 8, an edge portion of the first electrode 103a and an edge portion of the sub wiring 131a intersect with an edge portion of the second electrode 108a in a position where the insulating partition wall 107 is provided for the edge portion of the first electrode 103a and the edge portion of the sub wiring 131a. The second electrode 108a intersects with an edge portion of the first electrode 103b and an edge portion of the sub wiring 131b with the insulating partition wall 107 interposed therebetween in a position where the partition wall 107 is provided for the edge portion of the first electrode 103b and the edge portion of the sub wiring 131b. The second electrode 108a and the sub wiring 131b are directly connected to each other. The sub wiring 131b and the first electrode 103b are directly connected to each other. Thus, the second electrode 108a and the first electrode 103b are electrically connected to each other. Consequently, the first light-emitting element 31 and the second light-emitting element 32 are connected in series.

Thus, the light-emitting unit in which the first light-emitting element 31 and the second light-emitting element 32 are connected in series and the driving voltage is increased can be provided.

In FIG. 5C, as in Structural Examples 5 to 7, the first electrode and the second electrode are electrically connected to each other through the sub wiring. Thus, the formation of an insulating oxide film and an increase in electrical resistance can be suppressed by an appropriate selection of the material of the sub wiring.

In Structural Example 8, an edge portion of the second electrode 108a overlaps with the first electrode 103b with a protective layer (here, part of the partition wall 107) over the sub wiring 131b interposed therebetween, and an edge portion of the second electrode 108b overlaps with the first electrode 103b with the protective layer interposed therebetween. In Structural Example 8, the second electrode 108a and the second electrode 108b are electrically insulated from each other over the protective layer. The structure in which the protective layer is provided can prevent a short circuit between the second electrode 108a and the second electrode 108b which are electrically insulated from each other due to damage to the first light-emitting element 31 and the second light-emitting element 32 in a step of forming the second electrode 108a and the second electrode 108b.

The partition wall 107 includes a region where the partition wall 107 covers the edge portion of the first electrode 103a, the edge portion of the sub wiring 131a, the edge portion of the sub wiring 131b, and the edge portion of the first electrode 103b, and a region where the partition wall 107 is provided over the sub wiring 131b. This makes it possible to provide a light-emitting unit with high reliability, in which a short circuit between the first electrode 103a and the sub wiring 131a, and the second electrode 108a hardly occurs at a step portion formed at the edge portion of the first electrode 103a and the second electrode 108a is difficult to break at a step portion formed at the edge portion of the first electrode 103b and the edge portion of the sub wiring 131b.

<Material>

Examples of materials which can be used for each layer will be described below.

The substrate, the wirings, the planarization layer, the light-emitting elements, and the partition wall can have structures similar to those in Embodiment 1.

Note that since the sub wiring is provided in this embodiment, an increase in resistance can be suppressed even when the thickness of the first electrode is reduced to greater than or equal to 70 nm and less than or equal to 100 nm.

Further, in this embodiment, the first electrode and the second electrode are electrically connected to each other through the sub wiring. This prevents the formation of an insulating oxide film at an interface between the first electrode and the second electrode even when the first electrode and the second electrode are in contact with each other; thus, a single layer of aluminum may be used as the second electrode.

[Sub Wiring]

The sub wiring can be formed of a single layer or a stacked layer using a material such as copper (Cu), titanium (Ti), tantalum (Ta), tungsten (W), molybdenum (Mo), chromium (Cr), neodymium (Nd), scandium (Sc), or nickel (Ni), or an alloy material containing any of these materials as its main component. Aluminum can also be used as a material of the sub wiring. In that case, in order to prevent the above problem of corrosion, a stacked layer is formed and aluminum is used for a layer which is not in contact with ITO or the like. The sub wiring has a property of transmitting light emitted from a light-emitting organic compound. The thickness of the sub wiring is greater than or equal to 3 nm and less than or equal to 30 nm, preferably greater than or equal to 5 nm and less than or equal to 15 nm.

<Manufacturing Method>

Manufacturing methods of Structural Examples 5 to 8 described in this embodiment will be described with reference to FIGS. 12A to 12C.

<Structural Example 5>(FIGS. 4A and 4B, and FIG. 14B)

The step of forming the wiring 133a and the wiring 133b over the substrate, the step of forming the planarization layer 134, and the step of forming openings reaching the wiring 133a and the wiring 133b are performed in the same manner as in Embodiment 1; therefore, the description is omitted (FIG. 12A).

Next, a conductive film which is in contact with the wiring 133a and the wiring 133b through the openings and is to be a sub wiring is formed, and then a conductive film which is to be a first electrode is successively formed. After that, the first electrodes 103a to 103c and the extraction electrode 162 are formed by a known pattern forming method, followed by the formation of the sub wirings 131a to 131c and the extraction electrode 161.

After that, the partition wall 107 is formed so that the partition wall 107 covers one edge portion of each of the first electrodes 103a to 103c and fills gaps between the sub wirings 131a, 131b, and 131c (FIG. 12B).

It is preferable that the partition wall 107 have curvature on its upper edge in order to prevent the EL layer and the second electrode which are formed later from being broken. The partition wall 107 has curvature, whereby the step coverage with the EL layer and the second electrode can be favorable and the EL layer and the second electrode which are formed later can have an extremely small thickness.

Next, the EL layers 102a to 102c which cover exposed portions of the first electrodes 103a to 103c are formed. The EL layers can be formed using any of the structures and the methods which are given as examples in the later embodiment as appropriate.

Lastly, the second electrodes 108a to 108c are formed so that the second electrodes 108a to 108c cover parts of the EL layers and the partition wall 107 (FIG. 12C). The second electrodes can be formed by any of the methods given as examples in the above embodiment.

Through the above steps, Structural Example 5 can be formed.

The manufacturing method of Structural Example 5 can be applied to most of the manufacturing methods of Structural Examples 6 to 8. Differences in the manufacturing method between Structural Example 5 and Structural Examples 6 to 8 will be described below.

<Structural Example 6>

In order to obtain the structure (FIG. 5A) described as an example in Structural Example 6, the partition wall 107 which covers the other edge portion of the first electrode may also be formed in the step of forming the partition wall 107. In addition, the second electrode may be formed so that the edge portion of the second electrode overlaps with the first electrode with the partition wall 107 which covers the other edge of the first electrode interposed therebetween.

<Structural Example 7>

In order to obtain the structure (FIG. 5B) described as an example in Structural Example 7, after the formation of an opening in the planarization layer 134, a conductive film which is to be a first electrode is formed, followed by the formation of a conductive film which is to be a sub wiring. After that, the sub wirings 131a to 131c and the extraction electrode 161 are formed, and then the first electrodes 103a to 103c and the extraction electrode 162 are formed using the same pattern. Furthermore, the partition wall 107 which covers gaps between the sub wirings 131a, 131b, and 131c may also be formed in the step of forming the partition wall 107.

<Structural Example 8>

In order to form the structure (FIG. 5C) described as an example in Structural Example 8, in the manufacturing method of Structural Example 7, the partition wall 107 which is located over the sub wiring 131b may also be formed in the step of forming the partition wall 107. Furthermore, the second electrode may be formed so that the edge portion of the second electrode overlaps with the first electrode with the partition wall 107 over the sub wiring 131b interposed therebetween.

Each of the light-emitting units described in this embodiment includes the partition wall 107, and thus is a highly reliable light-emitting unit in which a short circuit between the first electrode and the second electrode hardly occurs at a step portion of the edge portion of the first electrode.

This embodiment can be freely combined with any of the other embodiments.

(Embodiment 3)

Figure 14C:
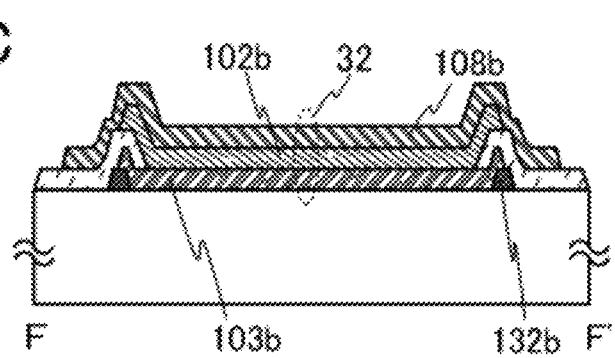

In this embodiment, light-emitting units each of which is one embodiment of the present invention will be described with reference to FIGS. 6A and 6B, FIGS. 7A to 7C, FIGS. 8A to 8C, and FIG. 14C. FIG. 6B is a cross-sectional view taken along line E-E' in FIG. 6A. FIG. 14C is a cross-sectional view taken along line F-F' in FIG. 6A.

In each of the light-emitting units described in this embodiment, an auxiliary wiring is provided in contact with a first electrode. When the auxiliary wiring is provided, a voltage drop due to the resistance of the first electrode can be suppressed. The auxiliary wiring contains a metal whose conductivity is higher than that of the first electrode.

<Structural Example>

First, structures of the light-emitting units in this embodiment will be described.

<Structural Example 9>

A light-emitting unit illustrated in FIG. 6B includes the wiring 133a, the wiring 133b, the planarization layer 134, an auxiliary wiring 132a, an auxiliary wiring 132b, an auxiliary wiring 132c, a first light-emitting element 41, a second light-emitting element 42, and a third light-emitting element 43 over the substrate 100.

Each of the light-emitting elements includes a first electrode formed over the planarization layer 134, an EL layer formed over the first electrode, and a second electrode formed over the EL layer.

The auxiliary wiring 132a is connected to the wiring 133a. In addition, the auxiliary wiring 132a is connected to a first electrode 103a. Thus, the wiring 133a and the first electrode 103a are electrically connected to each other. The second electrode 108c in the third light-emitting element 43 is connected to the wiring 133b through an extraction electrode 163. The extraction electrode 163 is formed using the same material as the auxiliary wirings.

In Structural Example 9, an edge portion of the first electrode 103a intersects with the second electrode 108a in a position where the insulating partition wall 107 is provided for the edge portion of the first electrode 103a. The second electrode 108a and the auxiliary wiring 132b are directly connected to each other. The auxiliary wiring 132b and the first electrode 103b are directly connected to each other. Specifically, the auxiliary wiring 132b is provided in contact with part of the first electrode 103b, which is located on the outer side than the second electrode 108b. Thus, the second electrode 108a and the first electrode 103b are electrically connected to each other. Consequently, the first light-emitting element 41 and the second light-emitting element 42 are connected in series.

The second electrode 108b and the auxiliary wiring 132c are directly connected to each other. The auxiliary wiring 132c and the first electrode 103c are directly connected to each other. Thus, the second electrode 108b and the first electrode 103c are electrically connected to each other. Consequently, the second light-emitting element 42 and the third light-emitting element 43 are connected in series.

Thus, the light-emitting unit in which the plurality of light-emitting elements are connected in series and the driving voltage is increased can be provided.

When a conductive oxide is used as a light-transmitting material used for the first electrode, an insulating oxide film is formed at an interface between the first electrode and the second electrode in some cases depending on the combination with a metal used for the second electrode. The formation of the insulating oxide film causes an increase in electrical resistance, which results in an increase in the power consumption of the light-emitting unit.

In FIG. 6B, however, the first electrode and the second electrode are electrically connected to each other through the auxiliary wiring. Thus, the formation of an insulating oxide film and an increase in electrical resistance can be suppressed by an appropriate selection of the material of the auxiliary wiring.

Figure 7A:
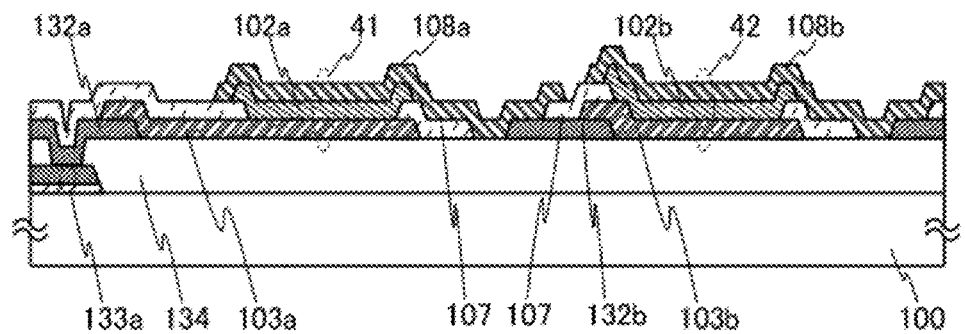
FIGS. 7A to 7C each illustrate a light-emitting unit of one embodiment of the present invention.

Note that the partition wall 107 may cover at least an edge portion of the first electrode 103a as illustrated in FIG. 7A. It is preferable that, as illustrated in FIG. 6B, the partition wall 107 be provided so that the partition wall 107 covers the edge portion of the first electrode 103a and an edge portion of the auxiliary wiring 132b. The structure illustrated in FIG. 6B enables a light-emitting unit with high reliability to be provided, in which a short circuit between the first electrode 103a and the second electrode 108a hardly occurs at a step portion formed at the edge portion of the first electrode 103a and the second electrode 108a is difficult to break at a step portion formed at the edge portion of the auxiliary wiring 132b.

In each of the light-emitting elements illustrated in FIG. 6B and FIG. 7A, both edge portions of the EL layer are located over the partition wall and both edge portions of the second electrode are also located over the partition wall.

In Structural Example 9, the second electrode 108*a* and the second electrode 108*b* are electrically insulated from each other over a protective layer (here, part of the partition wall 107) over the auxiliary wiring 132*b* and the first electrode 103*b*. The structure in which the protective layer is provided can prevent a short circuit between the second electrode 108*a* and the second electrode 108*b* which are electrically insulated from each other due to damage to the first light-emitting element 41 and the second light-emitting element 42 in a step of forming the second electrode 108*a* and the second electrode 108*b*.

Note that the structure of one embodiment of the present invention is not limited thereto. For example, as in the second light-emitting element 42 illustrated in FIG. 7B, one edge portion of the EL layer may be located over the first electrode and the other edge portion may be located over the partition wall; one edge portion of the second electrode may be located over the EL layer and the other edge portion may be located over the auxiliary wiring.

<Structural Example 10>

Figure 7B:
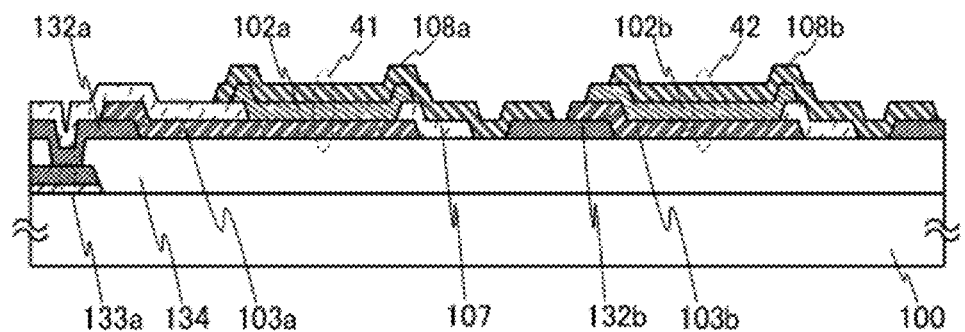

Specifically, a light-emitting unit illustrated in FIG. 7B includes the wiring 133*a*, the planarization layer 134, the auxiliary wiring 132*a*, the auxiliary wiring 132*b*, the first light-emitting element 41, and the second light-emitting element 42 over the substrate 100.

Each of the light-emitting elements includes a first electrode formed over the planarization layer 134, an EL layer formed over the first electrode, and a second electrode formed over the EL layer.

The auxiliary wiring 132*a* is connected to the wiring 133*a*. The auxiliary wiring 132*a* is connected to the first electrode 103*a*. Thus, the wiring 133*a* and the first electrode 103*a* are electrically connected to each other.

In Structural Example 10, an edge portion of the first electrode 103*a* intersects with the second electrode 108*a* in a position where the insulating partition wall 107 is provided for the edge portion of the first electrode 103*a*. The second electrode 108*a* and the auxiliary wiring 132*b* are directly connected to each other. The auxiliary wiring 132*b* and the first electrode 103*b* are directly connected to each other. Specifically, the auxiliary wiring 132*b* is provided in contact with part of the first electrode 103*b*, which is located on the outer side than the second electrode 108*b*. Thus, the second electrode 108*a* and the first electrode 103*b* are electrically connected to each other. Consequently, the first light-emitting element 41 and the second light-emitting element 42 are connected in series.

Thus, the light-emitting unit in which the first light-emitting element 41 and the second light-emitting element 42 are connected in series and the driving voltage is increased can be provided.

In FIG. 7B, the first electrode and the second electrode are electrically connected to each other through the auxiliary wiring. Thus, as in Structural Example 9, the formation of an insulating oxide film and an increase in electrical resistance can be suppressed by an appropriate selection of the material of the auxiliary wiring.

Figure 7C:
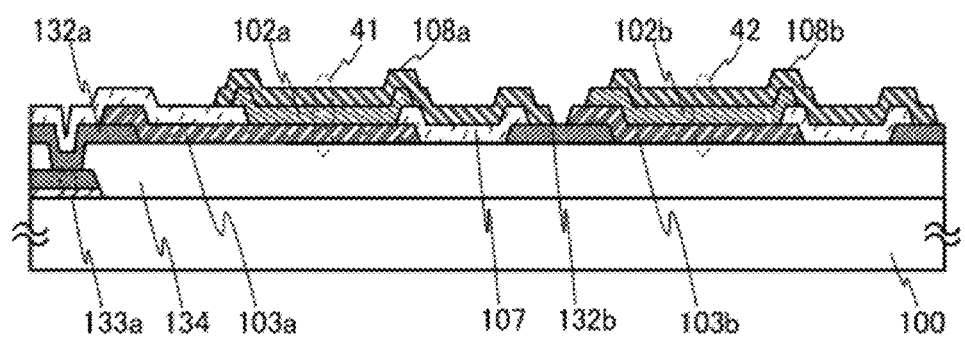

In FIG. 7B, the partition wall 107 is provided so that the partition wall 107 covers the edge portion of the first electrode 103*a*. This makes it possible to provide a light-emitting unit with high reliability, in which a short circuit between the first electrode 103*a* and the second electrode 108*a* hardly occurs at a step portion formed at the edge portion of the first electrode 103*a*. Furthermore, it is preferable that, as illustrated in FIG. 7C, the partition wall 107 be provided so that the partition wall 107 covers an edge portion of the first electrode 103*a* and an edge portion of the auxiliary wiring 132*b*. The structure in which the edge portion of the auxiliary wiring 132*b* is also covered makes it possible to provide a light-emitting unit with high reliability, in which the second electrode 108*a* is difficult to break at a step portion formed at the edge portion of the auxiliary wiring 132*b*.

Although one edge portion of the first electrode is formed over the auxiliary wiring (this structure is obtained by forming the first electrode after forming the auxiliary wiring) in each of Structural Examples 9 and 10, one edge portion of the auxiliary wiring can be formed over the first electrode (this structure is obtained by forming the auxiliary wiring after forming the first electrode) in one embodiment of the present invention.

Note that an edge portion of the EL layer might be thin when the EL layer is formed with a metal mask. For that reason, it is preferable to form a sufficiently wide EL layer. The EL layer 102*b* may cover an edge portion of the first electrode 103*b* as a result of forming a sufficiently wide EL layer. In that case, at least part of the second electrode 108*a* may be in contact with the auxiliary wiring 132*b*. This can be applied not only to the first light-emitting element 41 and the second light-emitting element 42 but also to the second light-emitting element 42 and the third light-emitting element 43.

<Structural Example 11>

Figure 8A:
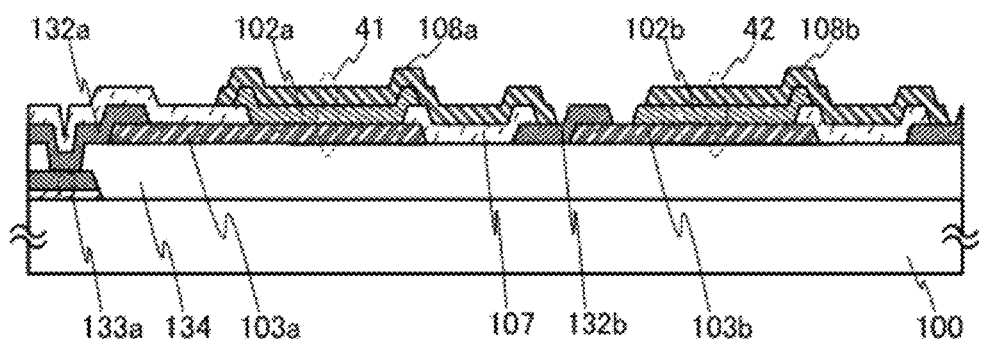
FIGS. 8A to 8C each illustrate a light-emitting unit of one embodiment of the present invention.

A light-emitting unit illustrated in FIG. 8A includes the wiring 133*a*, the planarization layer 134, the auxiliary wiring 132*a*, the auxiliary wiring 132*b*, the first light-emitting element 41, and the second light-emitting element 42 over the substrate 100.

Each of the light-emitting elements includes a first electrode formed over the planarization layer 134, an EL layer formed over the first electrode, and a second electrode formed over the EL layer.

The auxiliary wiring 132*a* is connected to the wiring 133*a*. The auxiliary wiring 132*a* is connected to the first electrode 103*a*. Thus, the wiring 133*a* and the first electrode 103*a* are electrically connected to each other.

In Structural Example 11, an edge portion of the first electrode 103*a* intersects with the second electrode 108*a* in a position where the insulating partition wall 107 is provided for the edge portion of the first electrode 103*a*. The second electrode 108*a* and the auxiliary wiring 132*b* are directly connected to each other. The auxiliary wiring 132*b* and the first electrode 103*b* are directly connected to each other. Specifically, the auxiliary wiring 132*b* is provided in contact with part of the first electrode 103*b*, which is located on the outer side than the second electrode 108*b*. Thus, the second electrode 108*a* and the first electrode 103*b* are electrically connected to each other. Consequently, the first light-emitting element 41 and the second light-emitting element 42 are connected in series.

Thus, the light-emitting unit in which the first light-emitting element 41 and the second light-emitting element 42 are connected in series and the driving voltage is increased can be provided.

In FIG. 8A, the first electrode and the second electrode are electrically connected to each other through the auxiliary wiring. Thus, as in Structural Examples 9 and 10, the formation of an insulating oxide film and an increase in electrical resistance can be suppressed by an appropriate selection of the material of the auxiliary wiring.

The partition wall 107 is provided so that the partition wall 107 covers the edge portion of the first electrode 103*a* and an edge portion of the auxiliary wiring 132*b*. This makes it possible to provide a light-emitting unit in which a short circuit between the first electrode 103*a* and the second electrode 108*a* hardly occurs at a step portion formed at the edge portion of the first electrode 103*a* and the second electrode 108*a* is difficult to break at a step portion formed at the auxiliary wiring 132*b*.

Further, as described in Structural Example 12 below, both edge portions of the EL layer may be located over the partition wall and both edge portions of the second electrode may also be located over the partition wall.

<Structural Example 12>

Figure 8B:
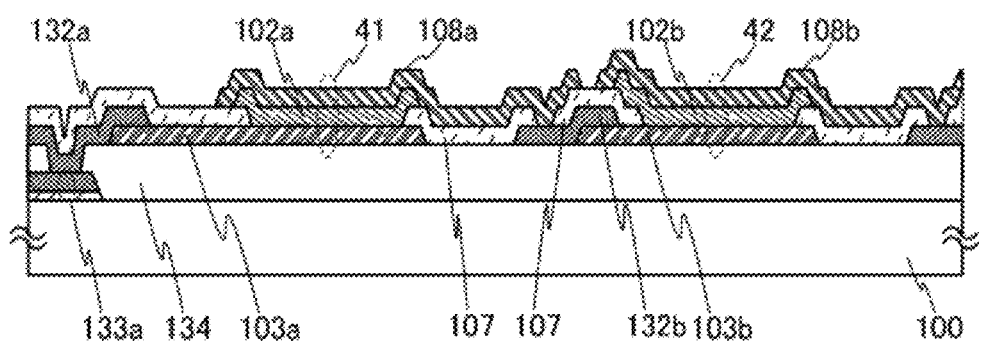

A light-emitting unit illustrated in FIG. 8B includes the wiring 133*a*, the planarization layer 134, the auxiliary wiring 132*a*, the auxiliary wiring 132*b*, the first light-emitting element 41, and the second light-emitting element 42 over the substrate 100.

Each of the light-emitting elements includes a first electrode formed over the planarization layer 134, an EL layer formed over the first electrode, and a second electrode formed over the EL layer.

The auxiliary wiring 132*a* is connected to the wiring 133*a*. In addition, the auxiliary wiring 132*a* is connected to the first electrode 103*a*. Thus, the wiring 133*a* and the first electrode 103*a* are electrically connected to each other.

In Structural Example 12, an edge portion of the first electrode 103*a* intersects with the second electrode 108*a* in a position where the insulating partition wall 107 is provided for the edge portion of the first electrode 103*a*. The second electrode 108*a* intersects with an edge portion of the first electrode 103*b* with the insulating partition wall 107 interposed therebetween in a position where the partition wall 107 is provided for the edge portion of the first electrode 103*b*. The second electrode 108*a* and the auxiliary wiring 132*b* are directly connected to each other. The auxiliary wiring 132*b* and the first electrode 103*b* are directly connected to each other. Specifically, the auxiliary wiring 132*b* is provided in contact with part of the first electrode 103*b*, which is located on the outer side than the second electrode 108*b*. Thus, the second electrode 108*a* and the first electrode 103*b* are electrically connected to each other. Consequently, the first light-emitting element 41 and the second light-emitting element 42 are connected to each other in series.

Thus, the light-emitting unit in which the first light-emitting element 41 and the second light-emitting element 42 are connected in series and the driving voltage is increased can be provided.

In FIG. 8B, the first electrode and the second electrode are electrically connected to each other through the auxiliary wiring. Thus, as in Structural Examples 9 to 11, the formation of an insulating oxide film and an increase in electrical resistance can be suppressed by an appropriate selection of the material of the auxiliary wiring.

The partition wall 107 includes a region where the partition wall 107 is provided so that the partition wall 107 covers the edge portion of the first electrode 103*a* and the edge portion of the auxiliary wiring 132*b* and a region where the partition wall 107 is provided over the auxiliary wiring 132*b* and the first electrode 103*b*.

In Structural Example 12, an edge portion of the second electrode 108*a* overlaps with the first electrode 103*b* with a protective layer (here, part of the partition wall 107) over the auxiliary wiring 132*b* and the first electrode 103*b* interposed therebetween, and an edge portion of the second electrode 108*b* overlaps with the first electrode 103*b* with the protective layer interposed therebetween. In Structural Example 12, the second electrode 108*a* and the second electrode 108*b* are electrically insulated from each other over the protective layer. The structure in which the protective layer is provided can prevent a short circuit between the second electrode 108*a* and the second electrode 108*b* which are electrically insulated from each other due to damage to the first light-emitting element 41 and the second light-emitting element 42 in a step of forming the second electrode 108*a* and the second electrode 108*b*.

Further, the auxiliary wiring can be provided in combination with any of the sub wirings described in the above embodiment. An example thereof will be described below.

<Structural Example 13>

Figure 8C:
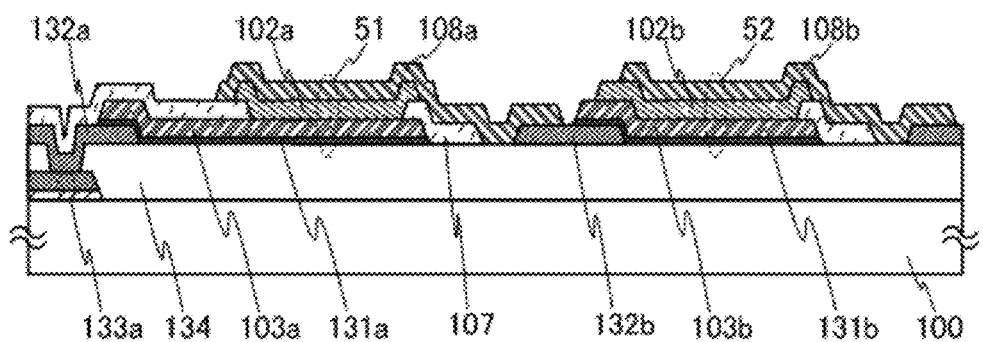

A light-emitting unit illustrated in FIG. 8C includes the wiring 133*a*, the planarization layer 134, the auxiliary wiring 132*a*, the auxiliary wiring 132*b*, a first light-emitting element 51, and a second light-emitting element 52 over the substrate 100.

Each of the light-emitting elements includes a sub wiring formed over the planarization layer 134, a first electrode formed over the sub wiring, an EL layer formed over the first electrode, and a second electrode formed over the EL layer.

The auxiliary wiring 132*a* is connected to the wiring 133*a* and the sub wiring 131*a*. In addition, the sub wiring 131*a* is connected to the first electrode 103*a*. Thus, the wiring 133*a* and the first electrode 103*a* are electrically connected to each other.

In Structural Example 13, an edge portion of the first electrode 103*a* and an edge portion of the sub wiring 131*a* intersect with the second electrode 108*a* in a position where the insulating partition wall 107 is provided for the edge portion of the first electrode 103*a* and the edge portion of the sub wiring 131*a*. The second electrode 108*a* and the auxiliary wiring 132*b* are directly connected to each other. The auxiliary wiring 132*b* and the sub wiring 131*b* are directly connected to each other. The sub wiring 131*b* and the first electrode 103*b* are directly connected to each other. Thus, the second electrode 108*a* and the first electrode 103*b* are electrically connected to each other. Consequently, the first light-emitting element 51 and the second light-emitting element 52 are connected in series.

Thus, the light-emitting unit in which the first light-emitting element 51 and the second light-emitting element 52 are connected in series and the driving voltage is increased can be provided.

In FIG. 8C, the first electrode and the second electrode are electrically connected to each other through the auxiliary wiring and the sub wiring. Thus, the formation of an insulating oxide film and an increase in electrical resistance can be suppressed by an appropriate selection of the material of the auxiliary wiring.

The partition wall 107 is provided so that the partition wall 107 covers the edge portion of the first electrode 103*a* and the edge portion of the sub wiring 131*a*. This makes it possible to provide a light-emitting unit with high reliability, in which a short circuit between the first electrode 103*a* and the second electrode 108*a* hardly occurs at a step portion formed at the edge portion of the first electrode 103*a* can be provided.

Examples of materials that can be used for each layer will be described below.

The substrate, the wirings, the planarization layer, the light-emitting elements, the partition wall, and the sub wirings can have structures similar to those in any of the above embodiments.

In this embodiment, the first electrode and the second electrode are electrically connected to each other through the auxiliary wiring. Thus, an insulating oxide film is not formed at an interface between the first electrode and the second electrode, which allows the second electrode to be formed of a single layer of aluminum.

[Auxiliary Wiring]

The auxiliary wiring can be formed of a single layer or a stacked layer using a material such as copper (Cu), titanium (Ti), tantalum (Ta), tungsten (W), molybdenum (Mo), chromium (Cr), neodymium (Nd), scandium (Sc), or nickel (Ni), or an alloy material containing any of these materials as its main component. Aluminum can also be used as a material of the auxiliary wiring. In that case, in order to prevent the above problem of corrosion, a stacked layer is formed and aluminum is used for a layer which is not in contact with ITO or the like. The thickness of the auxiliary wiring is greater than or equal to 0.1 µm and less than or equal to 3 µm, preferably greater than or equal to 0.1 µm and less than or equal to 0.5 µm.

Manufacturing methods of Structural Examples 9 to 12 described in this embodiment will be described with reference to FIGS. 13A to 13C.

<Structural Example 9>(FIGS. 6A and 6B, and FIG. 14C)

Figure 13A:
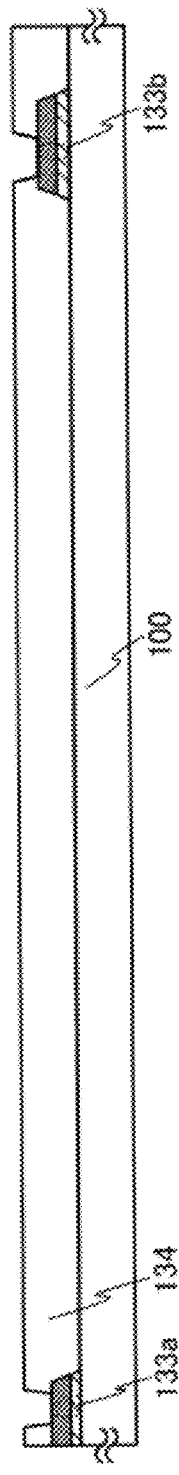
FIGS. 13A to 13C illustrate a manufacturing method of a light-emitting unit of one embodiment of the present invention.

Here, the formation of the wiring 133a and the wiring 133b over the substrate 100, the formation of the planarization layer 134, and the formation of openings reaching the wiring 133a and the wiring 133b are performed in the same manner as in Embodiment 1; therefore, the description is omitted (FIG. 13A).

Next, a conductive film which is in contact with the wiring 133a and the wiring 133b through the openings and is to be the auxiliary wiring is formed, and parts of the conductive film, which are not needed, are removed by a known pattern forming method, so that the auxiliary wirings 132a to 132c and the extraction electrode 163 are formed.

In addition, a conductive film which is to be the first electrode is formed, and parts of the conductive film, which are not needed, are removed, so that the first electrodes 103a to 103c are formed.

Figure 13B:
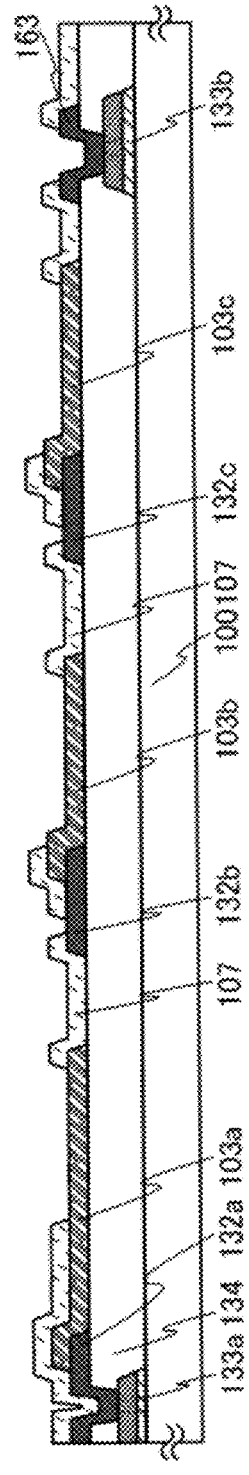

After that, the formation of the partition wall 107 which covers one edge portion of each of the first electrodes 103a to 103c and one edge portion of each of the auxiliary wirings 132a to 132c and the formation of the partition wall 107 which covers the other edge portion of each of the first electrode 103a to 103c over the auxiliary wirings 132a to 132c are performed at the same time (FIG. 13B).

It is preferable that the upper edge portion of the partition wall 107 have a curvature so that the EL layer and the second electrode which are formed later can be prevented from being broken. The upper edge portion of the partition wall 107 has a curvature, whereby the step coverage with the EL layer and the second electrode can be favorable and the EL layer and the second electrode which are formed later can have an extremely small thickness.

Next, the EL layers 102a to 102c which cover exposed portions of the first electrodes 103a to 103c are formed. These EL layers can be formed using structures and methods which are given as examples in the later embodiment as appropriate.

Figure 13C:
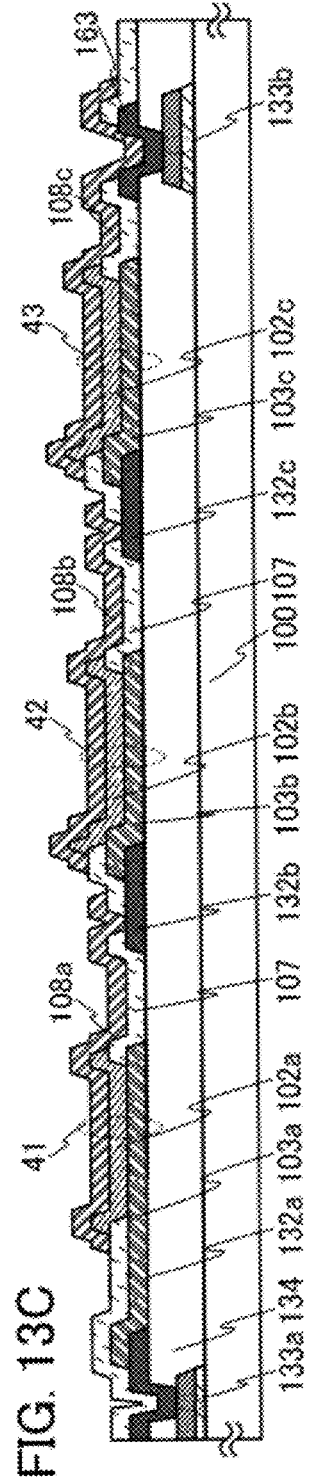

Lastly, the second electrodes 108a to 108c are formed so that the second electrodes 108a to 108c cover exposed portions of the EL layers 102a to 102c and are in contact with exposed portions of the auxiliary wirings 132a to 132c (FIG. 13C). The second electrodes can be formed by any of the methods given as examples in the above embodiment.

Through the above steps, Structural Example 9 (FIGS. 6A and 6B) can be formed.

Note that in order to obtain the structure illustrated in FIG. 7A, which is described in Structural Example 9, the partition wall 107 may be formed so that one edge portion of the auxiliary wiring is exposed in a step of forming the partition wall 107.

<Structural Example 10>

In order to obtain the structure illustrated in FIG. 7B, which is described in Structural Example 10, the following may be employed: the partition wall 107 which covers the other edge portion of the first electrode, which is located over the auxiliary wiring, is not formed and the edge portion of the second electrode is formed over the auxiliary wiring in a step of forming the partition wall 107 in the manufacturing method of the structure illustrated in FIG. 7A. Further, in order to obtain the structure illustrated in FIG. 7C, the partition wall may be formed so that the partition wall 107 fills a gap between the first electrode and the auxiliary wiring in a step of forming the partition wall 107.

<Structural Example 11>

In order to obtain the structure illustrated in FIG. 8A, which is described in Structural Example 11, the first electrode may be formed before the formation of the auxiliary wiring in the manufacturing method of the structure illustrated in FIG. 7C.

<Structural Example 12>

In order to obtain the structure illustrated in FIG. 8B, which is described in Structural Example 12, the first electrode may be formed before the formation of the auxiliary wiring in the manufacturing method of the structure illustrated in FIG. 6B.

In order to obtain the structure illustrated in FIG. 8C, which is described in Structural Example 13, in the manufacturing method of the structure illustrated in FIG. 7B, a conductive film which is to be the sub wiring may be formed, a conductive film which is to be the first electrode may be formed, and then unnecessary parts of the conductive films may be removed with the use of the same pattern, so that the first electrode and the sub wiring are formed.

Each of the light-emitting units described in this embodiment includes the partition wall 107, and thus is a highly reliable light-emitting unit in which a short circuit between the first electrode and the second electrode hardly occurs at a step portion at the edge portion of the first electrode.

This embodiment can be freely combined with any of the other embodiments.

(Embodiment 4)

In this embodiment, a light-emitting unit of one embodiment of the present invention will be described with reference to FIG. 9.

<Modification Example 1>

Figure 9:
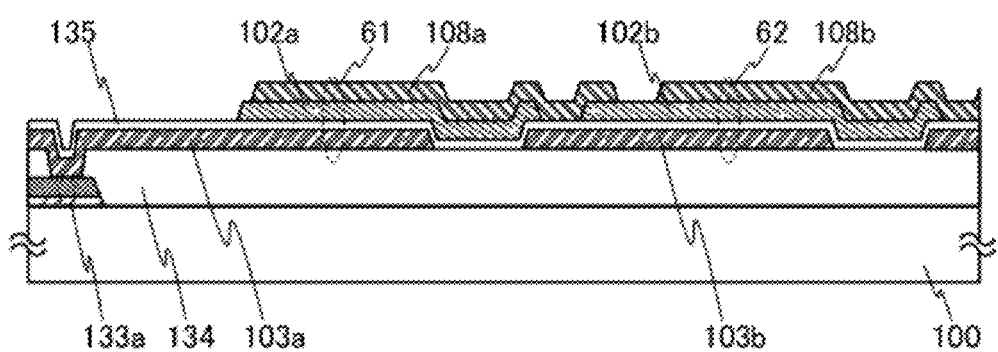
FIG. 9 illustrates a light-emitting unit of one embodiment of the present invention.

A light-emitting unit illustrated in FIG. 9 includes the wiring 133a, the planarization layer 134, a first light-emitting element 61, and a second light-emitting element 62 over the substrate 100.

Each of the light-emitting elements includes a first electrode formed over the planarization layer 134, a composite material layer 135 formed over the first electrode, an EL layer formed over the composite material layer 135, and a second electrode formed over the EL layer.

The first electrode 103a in the first light-emitting element 61 is connected to the wiring 133a.

The second electrode 108a and the first electrode 103b are electrically connected to each other through the composite material layer 135. Thus, the light-emitting unit in which the first light-emitting element 61 and the second light-emitting element 62 are connected in series and the driving voltage is increased can be provided.

The composite material layer 135 in the vertical direction in the drawing (thickness direction) is conductive because of sufficiently low resistance, whereas the composite material layer in the horizontal direction in the drawing is not conductive because of sufficient resistance.

In Modification Example 1, the partition wall described in the above embodiments is not provided; thus, a photomask for forming the partition wall is not needed, which simplifies the process. In Modification Example 1, the composite material layer 135 which can be formed with the use of an inexpensive metal mask is provided instead of the partition wall; thus, the manufacturing cost can be saved.

Examples of materials which can be used for each layer will be described below.

The substrate, the wiring, the planarization layer, and the light-emitting elements can have structures similar to those in Embodiment 1.

[Composite Material Layer]

A composite material in which an organic compound and an electron acceptor (acceptor) are mixed is given as the material which can be used for the composite material layer 135. Specifically, any of the materials described in Embodiment 1 can be used.

This embodiment can be freely combined with any of the other embodiments.

(Embodiment 5)

In this embodiment, a light-emitting unit of one embodiment of the present invention will be described with reference to FIG. 10A.

A light-emitting unit including an organic EL element emits light in a region where its refractive index is higher than the refractive index of the air. Thus, there is a condition under which total reflection occurs inside the light-emitting unit or at the boundary between the light-emitting unit and the air under a certain condition when light is extracted to the air, which causes a problem of a light extraction efficiency lower than 100%. It is generally said that the light extraction efficiency of the light-emitting unit is approximately 20% to 30%.

Specifically, in the case where the refractive index of a medium A is higher than the refractive index of a medium B and the refractive index of the medium B is lower than the refractive index of a layer containing a light-emitting organic compound, when light enters the medium B from the medium A, total reflection occurs in some cases depending on the incident angle.

At this time, it is preferable that an uneven structure be provided at the interface between the medium A and the medium B. Such a structure can suppress a phenomenon in which total reflection of light which enters the medium B from the medium A at an incident angle exceeding a critical angle occurs and the light propagates inside the light-emitting unit, which causes a reduction in the light extraction efficiency.

The light extraction efficiency of a light-emitting unit of one embodiment of the present invention described below can be approximately 1.2 times to 2 times higher than the light extraction efficiency of a light-emitting unit to which the present invention is not applied.

<Modification Example 2>

Figure 10A:
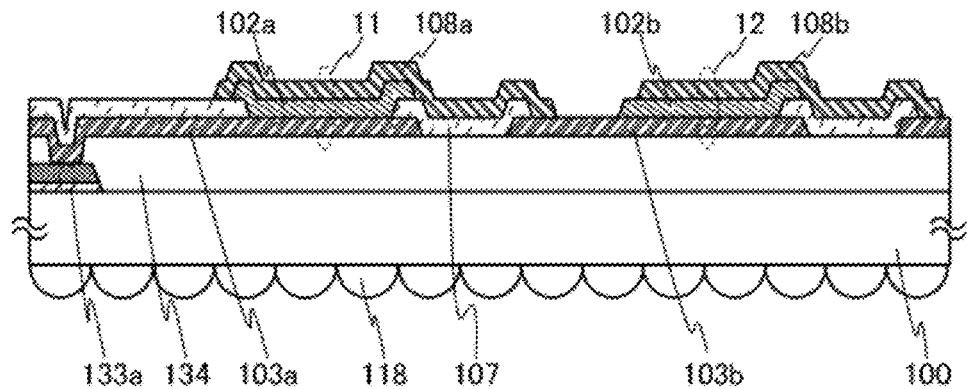
FIGS. 10A to 10C each illustrate a light-emitting unit of one embodiment of the present invention.

The light-emitting unit illustrated in FIG. 10A has the same structure as Structural Example 1 described in Embodiment 1 except for an uneven structure 118 provided on a surface of the substrate 100 on the side in contact with the air. The structural example which can be applied to Modification Example 2 is not limited to Structural Example 1. The structures described in the above embodiments can be employed as appropriate.

The refractive index of the substrate 100 is higher than the refractive index of the air; thus, total reflection occurs at the boundary between the substrate 100 and the air in some cases. In Modification Example 2, the uneven structure 118 is provided at the boundary between the air and the substrate 100, which makes it possible to reduce light which cannot be extracted due to the total reflection, so that the light extraction efficiency of the light-emitting unit can be increased.

Examples of materials which can be used for each layer will be described below.

The substrate, the light-emitting elements, and the partition wall can have structures similar to those in Embodiment 1.

[Uneven Structure]

The uneven structure 118 in a matrix is preferable although the uneven structure 118 in a striped form is effective. There is no particular limitation on the pattern of the unevenness; for example, a shape with a vertex such as a circular cone, a pyramid (e.g., a triangular pyramid or a square pyramid), or an umbrella shape, or a hemisphere can be used.

It is preferable that the size and height of the unevenness be approximately greater than or equal to 0.1 μm and less than or equal to 1000 μm. In particular, the unevenness preferably has a size or height greater than or equal to 1 μm, in which case the influence of interference of light can be reduced. Note that the uneven structure may have a size or height exceeding 1000 μm.

A pattern in which unevenness is provided so that gaps are not formed between adjacent portions of the unevenness is preferably provided. For example, it is preferable that in the pattern, the unevenness is provided in a closest-packed manner. In the pattern, the unevenness may be formed over part of or an entire air-contact surface of the substrate. It is preferable that the unevenness be formed at least in a light-emitting region.

The uneven structure can be formed in such a manner that a hemispherical lens, a micro lens array, a resin provided with an uneven structure, a film provided with an uneven structure, a light diffusing film, or the like is bonded to the surface of the substrate with a known adhesive or the like.

Alternatively, an uneven structure may be formed directly on the substrate. As a method for forming an uneven structure directly on the substrate, for example, an etching method, a sand blasting method, a microblast processing method, a droplet discharge method, a printing method (screen printing or offset printing by which a pattern is formed), a coating method such as a spin coating method, a dipping method, a dispenser method, a nanoimprint method, or the like can be employed as appropriate.

In one embodiment of the present invention, the uneven structure is provided on the surface which is in contact with the air, whereby light which cannot be extracted to the air due to total reflection can be reduced, which results in an increase in the light extraction efficiency of the light-emitting unit.

This embodiment can be freely combined with any of the other embodiments.

(Embodiment 6)

In this embodiment, light-emitting units each of which is one embodiment of the present invention will be described with reference to FIGS. 10B and 10C.

The structure in which the first electrode of the light-emitting element is in contact with the planarization layer and the planarization layer is in contact with the substrate is described in Embodiment 1 (e.g., FIGS. 1A and 1B). In general, the refractive index of a material used for a substrate (e.g., about 1.5 (refractive index of glass)) is lower than the refractive index of an EL layer (e.g., 1.6 or more). For that reason, when light enters the substrate from the first electrode through the planarization layer, the light is totally reflected in some cases. Thus, it is preferable that an uneven structure body be provided at a boundary with a condition under which the total reflection occurs.

However, when the first electrode is uneven, leakage current might be generated in the EL layer or the like formed over the first electrode.

In each of the light-emitting units described in this embodiment, an uneven structure body is provided over a substrate, a resin layer and a planarization layer are provided over the uneven structure body, and a first electrode is provided over the planarization layer; thus, the generation of leakage current in an EL layer or the like can be suppressed.

Moreover, when the uneven structure body is provided, light which cannot be extracted to the air due to total reflection at the boundary between the substrate and the resin layer can be reduced, which results in an increase in the light extraction efficiency of the light-emitting unit.

Further, when the resin layer and the planarization layer are each formed using a material whose refractive index is higher than the refractive index of the EL layer (in particular, a layer containing a light-emitting organic compound), a light-emitting unit in which total reflection is suppressed can be achieved.

<Modification Example 3>

Figure 10B:
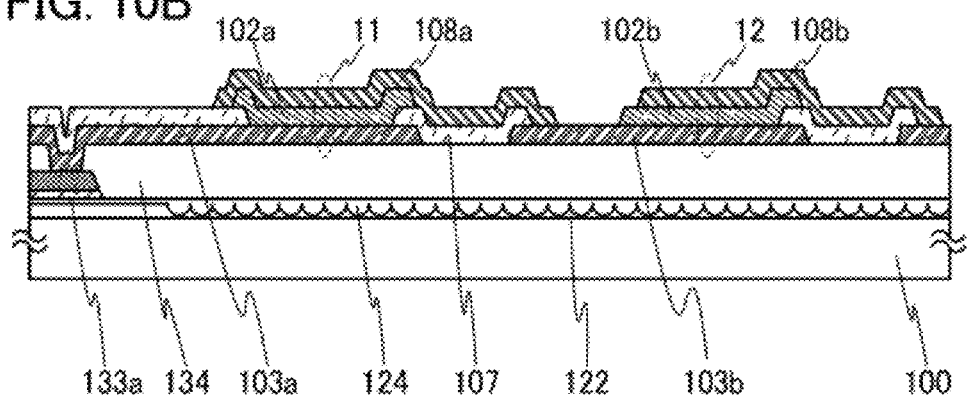

A light-emitting unit illustrated in FIG. 10B includes an uneven structure body 122 over the substrate 100. In addition, the light-emitting unit includes a resin layer 124 over the uneven structure body 122. Except for these, the light-emitting unit has the same structure as Structural Example 1 described in Embodiment 1. The structural example which can be applied to Modification Example 3 is not limited to Structural Example 1. The structures described in the above embodiments can be employed as appropriate.

In Modification Example 3, the refractive index of each of the planarization layer 134 and the resin layer 124 is higher than the refractive index of a layer containing a light-emitting organic compound included in the EL layer or the refractive index of the first electrode. Such a structure makes it possible to prevent total reflection at the interface between the resin layer 124 and the planarization layer 134 and the interface between the planarization layer 134 and the first electrode.

In Modification Example 3, the refractive index of the substrate 100 is lower than the refractive index of the layer containing a light-emitting organic compound included in the EL layer (e.g., 1.6 or more). Thus, there is a condition under which total reflection occurs at the interface between the substrate 100 and the resin layer 124.

In Modification Example 3, the uneven structure body 122 is provided over a surface where the substrate 100 is in contact with the resin layer 124. Such a structure can suppress a phenomenon in which total reflection of light which enters at an incident angle exceeding a critical angle occurs and the light propagates inside the light-emitting unit, which causes a reduction in the light extraction efficiency.

A protective film may be formed between the resin layer 124 and the first electrode. When the protective film is provided, moisture can be prevented from entering the EL layer from the resin layer 124; thus, a reduction in the lifetime of the light-emitting unit can be suppressed.

Figure 10C:
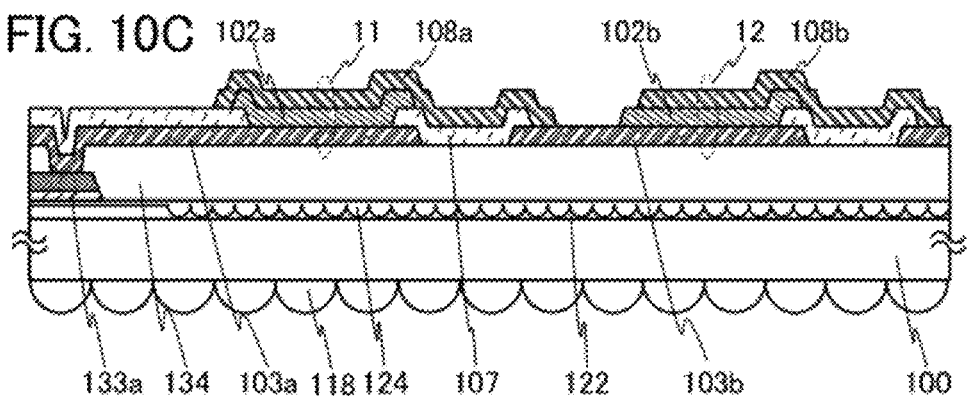

Note that FIG. 10C illustrates an example of a structure in which the uneven structure body 122 and the uneven structure 118 described in the above embodiment are combined.

Examples of materials which can be used for each layer will be described below.

The substrate, the wiring, the light-emitting elements, and the partition wall can have structures similar to those in Embodiment 1.

[Resin Layer]

Examples of materials for the resin layer 124 include a liquid, a resin, and the like with a high refractive index. The resin layer 124 has a light-transmitting property. Examples of the resin with a high refractive index include a resin containing bromine and a resin containing sulfur. For example, a sulfur-containing polyimide resin, an episulfide resin, a thiourethane resin, and a brominated aromatic resin can be used. In addition, polyethylene terephthalate (PET), triacetyl cellulose (TAC), or the like can be used. As the liquid with a high refractive index, a contact liquid (refractive liquid) containing sulfur and methylene iodide, or the like can be used. Any of a variety of methods suitable for the material may be employed for forming the resin layer 124. For example, any of the above resins is deposited by a spin coating method and is cured by heat or light, so that the resin layer 124 can be formed. The material and the deposition method can be selected as appropriate in consideration of the adhesion strength, ease of processing, or the like.

[Planarization Layer]

The planarization layer 134 can be formed using any of the above resins with a high refractive index, which are given as the materials for the resin layer 124.

[Protective Film]

The protective film can be formed of a silicon nitride film, a silicon nitride oxide film, an aluminum nitride film, or the like.

[Uneven Structure Body]

The uneven structure body 122 can be formed in such a manner that a hemispherical lens, a micro lens array, a resin provided with an uneven structure, a film provided with an uneven structure, a light diffusing film, or the like is bonded to the surface of the substrate 100 with a known adhesive or the like. The uneven structure body can be formed directly on the substrate in a manner similar to that of the uneven structure.

The uneven structure body in a matrix is preferable although the uneven structure body 122 in a striped form is effective. There is no particular limitation on the pattern of the unevenness; for example, a shape with a vertex such as a circular cone, a pyramid (e.g., a triangular pyramid or a square pyramid), or an umbrella shape, or a hemisphere can be used.

It is preferable that the size and height of the unevenness be approximately greater than or equal to 0.1 μm and less than or equal to 1000 μm. In particular, the unevenness preferably has a size or height greater than or equal to 1 μm, in which case the influence of interference of light can be reduced. The size and height of the unevenness affect the usage amount of the material for the resin layer. The unevenness preferably has a size or height less than or equal to 100 μm, in which case the use of a large amount of materials for the resin layer can be reduced.

When the pattern of the unevenness is periodic in the uneven structure body 122 whose size is in the above range, the unevenness functions as a diffraction grating, so that an interference effect is increased and light with a certain wavelength is easily extracted to the air. For that reason, it is preferable that the pattern of the unevenness be not periodic. Further, the pattern is formed at least in a light-emitting region.

In this embodiment, the uneven structure is provided, whereby total reflection of light which enters at an incident angle exceeding a critical angle and a reduction in the light extraction efficiency due to the propagation of the light inside the light-emitting unit can be suppressed.

This embodiment can be freely combined with any of the other embodiments.

(Embodiment 7)

In this embodiment, one embodiment of a light-emitting device including any of the light-emitting units described as examples in the above embodiments will be described with reference to FIGS. 15A to 15C and FIGS. 16A and 16B.

Figure 15A:
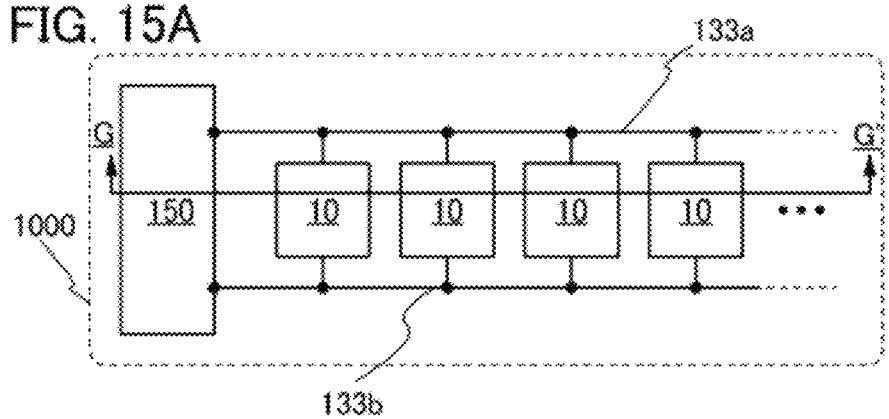
FIGS. 15A to 15C illustrate a light-emitting device of one embodiment of the present invention.

FIG. 15A is a schematic view of a structure of a light-emitting device 1000 that is one embodiment of the present invention.

The light-emitting device 1000 includes a converter 150 and a plurality of light-emitting units 10. The plurality of light-emitting units 10 are connected in parallel, and each of the light-emitting units 10 is connected to the wiring 133a and the wiring 133b, which are connected to the converter 150.

As the converter 150, for example, an AC-DC converter which converts a voltage output from an alternating-current power source for home use into a direct-current voltage, a DC-DC converter, or the like, can be used. Different voltages are output to the wiring 133a and the wiring 133b, which are connected to the converter 150. Current flows to the light-emitting units 10 by this voltage difference between the wiring 133a and the wiring 133b, so that the light-emitting units 10 emit light.

The number of the plurality of light-emitting units 10 connected in parallel may be set as appropriate depending on the output characteristics of the converter 150. The number of the light-emitting units 10 connected in parallel can increase as the amount of current that flows from the converter 150 increases.

Figure 15B:
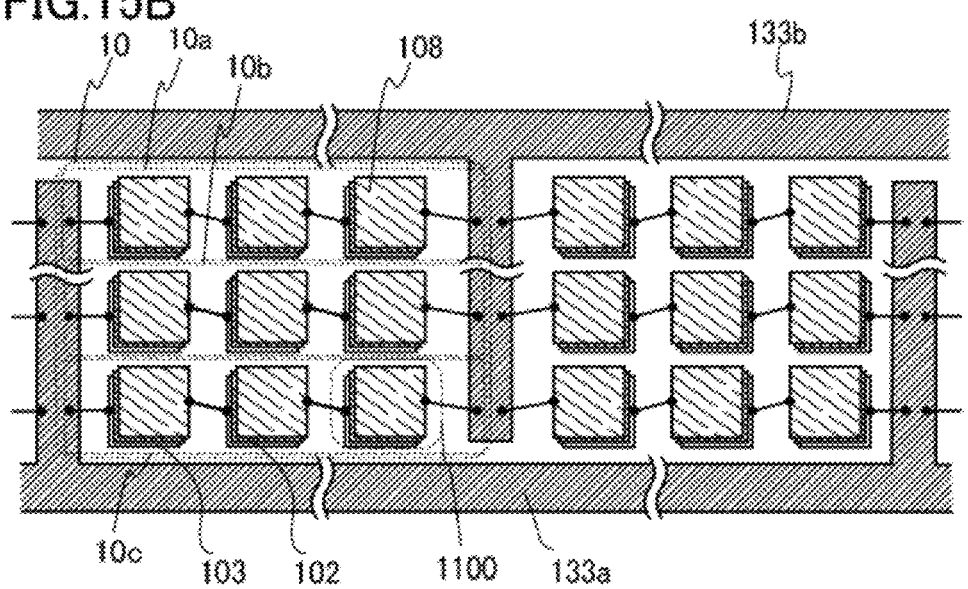
Figure 15C:
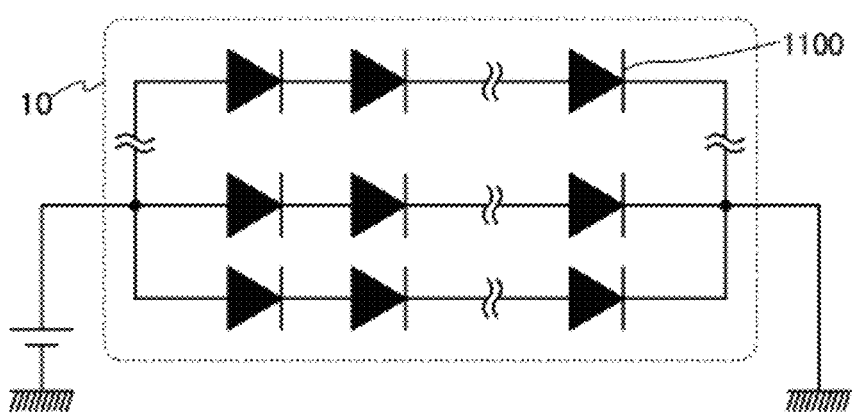

Next, a structure of the light-emitting unit 10 will be described with reference to FIGS. 15B and 15C. FIG. 15B is a schematic view illustrating the structure and the connection relation of the light-emitting units 10. FIG. 15C illustrates an equivalent circuit for describing the connection relations of a plurality of light-emitting elements 1100 in the light-emitting unit 10.

Light-emitting units 10a to 10c illustrated in FIG. 15B each include the plurality of light-emitting elements 1100 and are each connected to the wiring 133a and the wiring 133b. In this embodiment, the light-emitting unit 10 with a structure in which the plurality of light-emitting elements 1100 are arranged in matrix in the row direction and the column direction, is described as an example. The number of the light-emitting elements 1100 provided in the light-emitting unit 10 may be set as appropriate depending on the output characteristics of the converter 150, a layout, or the like.

Any of the light-emitting elements described as examples in the above embodiments can be used as the light-emitting element 1100, and the light-emitting element 1100 includes the first electrode 103, the EL layer 102, and the second electrode 108.

The light-emitting elements 1100 are connected in series in the row direction. Specifically, the second electrode 108 in any of the light-emitting elements 1100 arranged in the row direction is connected to the first electrode 103 in the adjacent light-emitting element 1100, and this structure is repeated; thus, the light-emitting elements 1100 are connected in series. The two light-emitting elements 1100, which are connected in series, can be connected with the use of any of the methods and the structures given as examples in the above embodiments. In addition, groups each including the plurality of light-emitting elements 1100 connected in series are arranged in parallel in the column direction.

In FIG. 15B, the two light-emitting units 10 are provided symmetrically. With such a structure, the light-emitting units 10 can share part of the wiring 133a and part of the wiring 133b, which are connected to the light-emitting elements, so that a space between the light-emitting units 10 can be small; therefore, the area of light emission with respect to the area of the substrate can be large.

FIG. 15C illustrates the equivalent circuit showing the above-described connection relation. By connecting the groups, in each of which the light-emitting elements 1100 are connected in series, in parallel in such a manner, even in the case where one of the light-emitting elements 1100 in the light-emitting unit 10 is short-circuited, light can be emitted without blocking the flow of current through the other light-emitting elements.

In this embodiment, the groups each including the light-emitting elements connected in series are connected in parallel. However, a structure may be employed in which in the light-emitting elements adjacent to each other in the column direction, the first electrode and the second electrode of the light-emitting element are respectively connected to the first electrode and the second electrode of the adjacent light-emitting element, so that the light-emitting elements are connected in parallel in the column direction. As described above, with a connection relation combining a series connection and a parallel connection, even when one of the light-emitting elements 1100 in the light-emitting unit 10 is short-circuited or insulated, light can be emitted without blocking the flow of current through the other light-emitting elements 1100 adjacent to the light-emitting element 1100.

FIGS. 16A and 16B are cross-sectional views taken along line G-G' in FIG. 15A.

An example of a light-emitting device using an organic resin substrate as a substrate will be described with reference to FIG. 16A. (That is, a first substrate 100a in FIG. 16A corresponds to the substrate 100 illustrated in FIG. 1B and the like.) In the light-emitting device illustrated in FIG. 16A, a first glass layer 173a is formed over the first substrate 100a, and the plurality of light-emitting units 10 are provided over the first glass layer 173a. In FIG. 16A, the first glass layer 173a and a second glass layer 173b are bonded to each other with a sealant 171. In the light-emitting device illustrated in FIG. 16A, the light-emitting unit 10 is provided in a space 175 surrounded by the first glass layer 173a, the second glass layer 173b, and the sealant 171. The first substrate 100a and a second substrate 100b are bonded to each other with a sealant 172.

In the light-emitting device, the first substrate 100a and the second substrate 100b are preferably formed of the same organic resin material. When the first substrate 100a and the second substrate 100b are formed of the same material, the occurrence of defective shape due to heat distortion or physical impact can be prevented. Therefore, the occurrence of deformation or breakage of the lighting device can be prevented at the time of manufacturing or using the light-emitting device.

An organic resin substrate and a glass layer are used in the light-emitting device of one embodiment of the present invention. For this reason, the light-emitting device can be reduced in weight. Moreover, the entry of moisture, an impurity, or the like into an organic compound or a metal material included in the light-emitting unit from the outside of the light-emitting device can be prevented.

An example of a light-emitting device using a glass substrate as a first substrate and using a metal substrate as a second substrate will be described with reference to FIG. 16B. (That is, the first substrate 100a in FIG. 16B corresponds to the substrate 100 illustrated in FIG. 1B and the like.) In the light-emitting device illustrated in FIG. 16B, the plurality of light-emitting units 10 are provided over the first substrate 100a. In FIG. 16B, the first substrate 100a and the second substrate 100b are bonded to each other with the sealant 171 and the sealant 172.

There is no particular limitation on the material of a metal substrate used as the second substrate, but it is preferable to use a metal such as aluminum, copper, or nickel; a metal alloy such as an aluminum alloy or stainless steel; or the like. There is no particular limitation on the thickness of the metal substrate. For example, a metal substrate with a thickness greater than or equal to 10 μm and less than or equal to 200 μm is preferably used, in which case the light-emitting device can be reduced in weight.

As the second substrate, a glass substrate, a quartz substrate, or the like can be used other than the metal substrate.

The converter 150 can be provided between the upper substrate and the lower substrate (FIG. 16A). Further, when the second substrate 100b is smaller than the first substrate 100a as illustrated in FIG. 16B, a thick converter can be provided without changing the thickness of the light-emitting device.

A space may be provided between the sealant 171 and the sealant 172. Alternatively, the sealant 171 and the sealant 172 may be in contact with each other.

[Space]

As a filler, an inert gas (such as nitrogen or argon) fills the space 175 (FIG. 16A). The space 175 can be filled with the sealant 171 (FIG. 16B). Further, in the light-emitting device in FIG. 16A, a filler that is different from the sealant 171 and the sealant 172 can be used to fill the space 175. When a material with low viscosity is used as a filler among the materials for a sealant, the space 175 can be easily filled.

[Sealant]

A known material can be used as the sealant. For example, a thermosetting material or a UV curable material may be used. A material capable of bonding glass is used for the sealant 171, and a material capable of bonding organic resins is used for the sealant 172. It is desirable that these materials transmit as little moisture or oxygen as possible. In addition, a sealant containing a dry agent can be used.

A dry agent may be introduced into the space 175. For example, a substance which absorbs moisture by chemical adsorption, such as an oxide of an alkaline earth metal (e.g., calcium oxide or barium oxide), can be used. Other than the above, a substance which adsorbs moisture by physical adsorption, such as zeolite or silica gel, may be used as the dry agent.

This embodiment can be freely combined with any of the other embodiments.

(Embodiment 8)

In this embodiment, an example of an EL layer which can be applied to one embodiment of the present invention will be described with reference to FIGS. 17A to 17C.

Figure 17A:
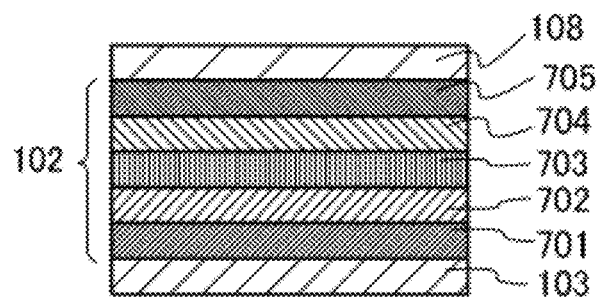
FIGS. 17A to 17C each illustrate an EL layer applicable to one embodiment of the present invention.

As illustrated in FIG. 17A, the EL layer 102 is provided between the first electrode 103 and the second electrode 108.

The first electrode 103 and the second electrode 108 can have structures similar to those in Embodiment 1.

In this embodiment, in the EL layer 102, a hole-injection layer 701, a hole-transport layer 702, a layer 703 containing a light-emitting organic compound, an electron-transport layer 704, and an electron-injection layer 705 are stacked in this order from the first electrode 103 side.

A manufacturing method of the light-emitting element illustrated in FIG. 17A will be described.

The hole-injection layer 701 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$), or copper(II) phthalocyanine (abbreviation: CuPc) can also be used.

Alternatively, aromatic amine compounds such as TDATA, MTDATA, DPAB, DNTPD, DPA3B, PCzPCA1, PCzPCA2, and PCzPCN1, which are low molecular organic compounds, or the like can be used.

Further alternatively, any of high molecular compounds (e.g., oligomers, dendrimers, or polymers) can be used. For example, the following high molecular compounds can be used: PVK, PVTPA, PTPDMA, and Poly-TPD. A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, excellent hole injection from the first electrode 103 can be obtained, which results in a reduction in the driving voltage of the light-emitting element. Such a composite material can be formed by co-evaporation of a substance having a high hole-transport property and a substance having an acceptor property. When the hole-injection layer 701 is formed using the composite material, holes are easily injected from the first electrode 103 into the EL layer 102.

As the organic compound for the composite material, various compounds such as an aromatic amine compound, carbazole derivatives, aromatic hydrocarbon, and a high molecular compound (e.g., oligomers, dendrimers, or polymers) can be used. The organic compound used for the composite material is preferably an organic compound having a high hole-transport property. Specifically, a substance having a hole mobility of $10^{-6}$ cm$^2$/Vs or higher is preferably used. It is to be noted that a substance other than the above may be used as long as it has a higher hole transport property than an electron transport property. The organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1, NPB, TPD, and BPAFLP; and carbazole derivatives such as CBP, TCPB, CzPA, PCzPA, and 1,4-bis[4-(N-carbazolyl)-phenyl-2,3,5,6-tetraphenyl-benzene.

Aromatic hydrocarbon compounds such as t-BuDNA, DPPA, t-BuDBA, DPAnth, t-BuAnth, DMNA, 9,10-bis[2-

(1-naphthyl)phenyl]-2-tert-butylanthracene, 9,10-bis[2-(1-naphthyl)phenyl]anthracene, or 2,3,6,7-tetramethyl-9,10-di (1-naphthyl)anthracene can also be used.

An aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, DPVBi, or DPVPA can also be used.

As the electron acceptor, organic compounds such as $F_4$-TCNQ and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is particularly preferable because it is stable in the air, has a low hygroscopic property, and is easily handled.

Note that the hole injection layer 701 may be formed using a composite material of the high molecular compound such as PVK, PVTPA, PTPDMA, or Poly-TPD, and the electron acceptor.

The hole-transport layer 702 is a layer containing a substance with a high hole-transport property. As the substance having a high hole-transport property, any of the following aromatic amine compounds can be used, for example: NPB, TPD, BPAFLP, 4,4'-bis[N-(9,9-dimethyl-fluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/V·s or higher. Note that a substance other than the above may be used as long as it has a higher hole transport property than an electron transport property. The layer containing a substance having a high hole transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can be used.

For the layer 703 containing a light-emitting organic compound, a fluorescent compound which exhibits fluorescence or a phosphorescent compound which exhibits phosphorescence can be used.

As the fluorescent compound that can be used for the layer 703 containing a light-emitting organic compound, a material for blue light emission, a material for green light emission, a material for yellow light emission, and a material for red light emission are given. Examples of the material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yOtriphenylamine (abbreviation: PCBAPA), and the like. Example of the material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Examples of the material for yellow light emission include rubrene, 5,12-bis(1,1'-biphenyl-4-yl)-6,11-diphenyltetracene (abbreviation: BPT), and the like. Examples of the material for red light emission include N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like.

As the phosphorescent compound that can be used for the layer 703 containing a light-emitting organic compound, a material for blue light emission, a material for green light emission, a material for yellow light emission, a material for orange light emission, a material for red light emission are given. Examples of the material for blue light emission include bis[2-(4',6'-difluorophenyl)pyridinato-N,C$^{2'}$]iridium (III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ ppy)$_2$(pic)), bis[2-(4',6'-difluorophenyl)pyridinato-N,C$^{2'}$]iridium(III)acetylacetonate (abbreviation: FIr(acac)), and the like. Examples of the material for green light emission include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the material for yellow light emission include bis(2,4-diphenyl-1,3-oxazolato-N,C$^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dm-moppr)$_2$(acac)), and the like. Examples of the material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir (pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the material for red light emission include organometallic complexes such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and (2,3,7,8,12,13,17,18-octaethyl-21H,23H-porphyrin)platinum(II) (abbreviation: PtOEP). In addition, rare earth metal complexes, such as tris(acetylacetonato) (monophenanthroline)terbium(III)

(abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare earth metal ions (electron transition between different multiplicities), and thus can be used as phosphorescent compounds.

Note that the layer 703 containing a light-emitting organic compound may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyOdiphenanthrene (abbreviation: DPNS), 9,9'-(stilbene-4,4'-diyl)diphenanthrene (abbreviation: DPNS2), 3,3',3"-(benzene-1,3,5-triyOtripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Plural kinds of materials can be used as the host material. For example, in order to suppress crystallization, a substance such as rubrene which suppresses crystallization may be further added. In addition, NPB, Alq, or the like may be further added in order to transfer energy efficiently to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], or the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis (N,N'-diphenylamino)-1,4-phenylene]} (abbreviation: CN-PPV-DPD), and the like.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron-transport layer 704 is a layer containing a substance with a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/V·s or higher. The electron transport layer is not limited to a single layer, and may be a stack of two or more layers containing any of the above substances.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 17B:
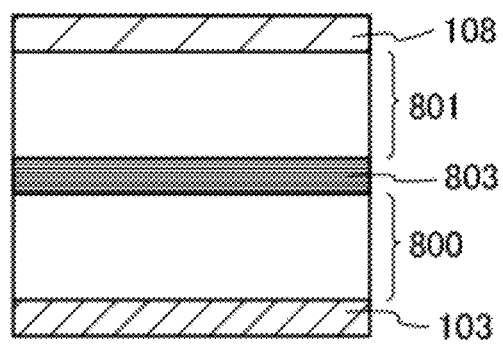

Note that a plurality of EL layers 102 may be stacked between the first electrode 103 and the second electrode 108 as illustrated in FIG. 17B. In that case, a charge generation layer 803 is preferably provided between a first EL layer 800 and a second EL layer 801 which are stacked. The charge generation layer 803 can be formed by using the above-described composite material. Further, the charge generation layer 803 may have a stacked structure including a layer containing the composite material and a layer containing another material. In that case, as the layer containing another material, a layer containing an electron donating substance and a substance with a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be easily obtained. Note that this structure can be combined with the above-described structures of the EL layer.

Furthermore, by making emission colors of EL layers different, light of a desired color can be obtained from the light-emitting element as a whole. For example, in a light-emitting element having the two EL layers, the emission colors of the first and second EL layers are complementary, so that the light-emitting element can be made to emit white light as a whole. Further, the same applies to a light-emitting element having three or more EL layers.

Figure 17C:
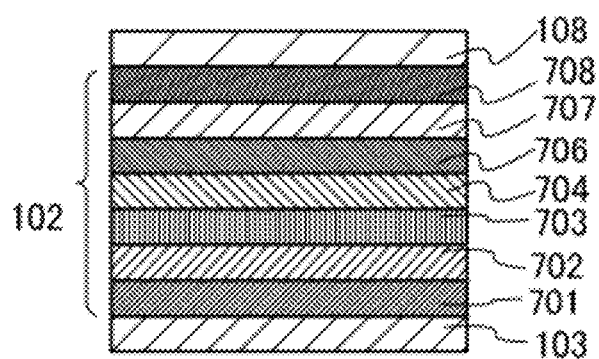

As illustrated in FIG. 17C, the EL layer 102 may include, between the first electrode 103 and the second electrode 108, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 108.

The composite material layer 708 which is in contact with the second electrode 108 is preferably provided, in which case damage caused to the EL layer 102 particularly when the second electrode 108 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

For the electron-injection buffer layer 706, a substance having a high electron-injection property, such as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate) can be used.

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Examples of the donor substance include an organic compound such as tetrathianaphthacene (abbreviation: TTN), nickelocene, and decamethylnickelocene, in addition to an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and carbonate), and a rare earth metal compound (e.g., an oxide, a halide, and carbonate)). Note that as the substance having a high electron-transport property, a material similar to the material for the electron transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Therefore, an increase in driving voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the followings is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex which has a metal-oxygen bond and an aromatic ligand and is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. Thus, a phthalocyanine derivative has an advantage of being easily handled during formation of the light-emitting element and an advantage of facilitating maintenance of an apparatus used for forming a film.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following are given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Other than the above, 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N-bis(2,2,3,3,4,4,5,5,6,6,7,7,8,8,8-pentadecafluorooctyl)-1,4,5,8-naphthalenetetracar boxylic diimide (abbreviation: NTCDI-C8F), 3',4'-dibutyl-5,5''-bis(dicyanomethylene)-5,5''-dihydro-2,2':5',2''-terthiophene) (abbreviation: DCMT), methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the above-described materials.

In the above manner, the EL layer 102 of this embodiment can be manufactured.

This embodiment can be freely combined with any of the other embodiments.

(Embodiment 9)

In this embodiment, an example of a lighting device including the light-emitting unit of one embodiment of the present invention will be described with reference to FIGS. 18A and 18B.

In this embodiment, a lighting device whose light-emitting portion has a curved surface can be provided.

One embodiment of the present invention can be used for lighting in a car; for example, lighting can be provided for a dashboard, ceiling, or the like.

Figure 18A:
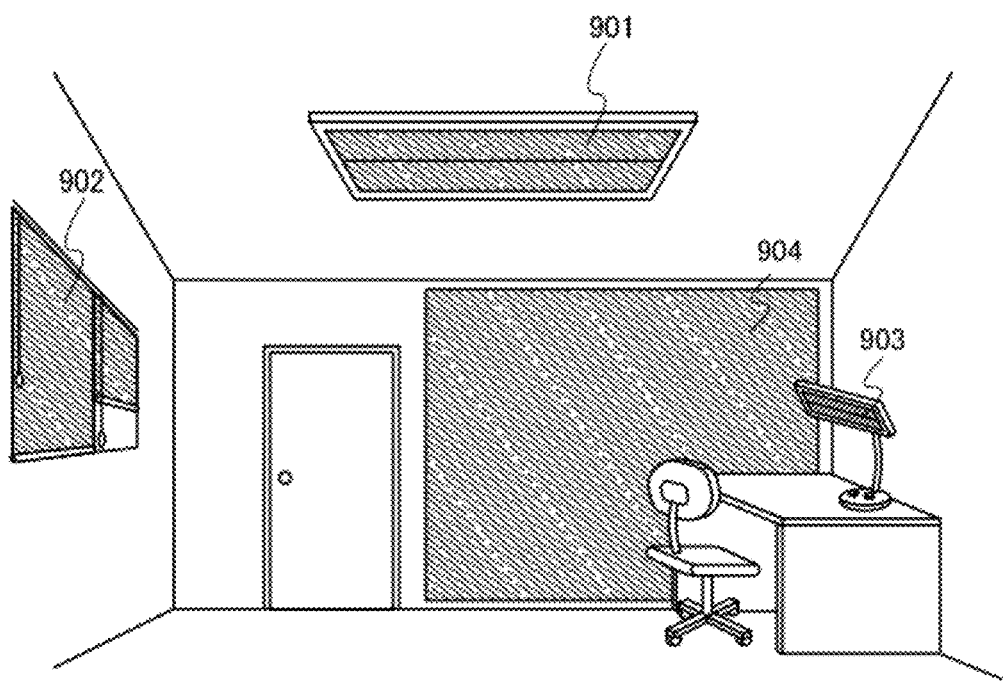
FIGS. 18A and 18B each illustrate a lighting device of one embodiment of the present invention.

FIG. 18A illustrates an interior lighting device 901, a desk lamp 903, and a planar lighting device 904 to which one embodiment of the present invention is applied. The area of the light-emitting device can be increased, and therefore can be used as a large-area lighting device. Further, since the light-emitting device is thin, the light-emitting device can be mounted on a wall. Furthermore, the light-emitting device can be used as a roll-type lighting device 902.

Figure 18B:
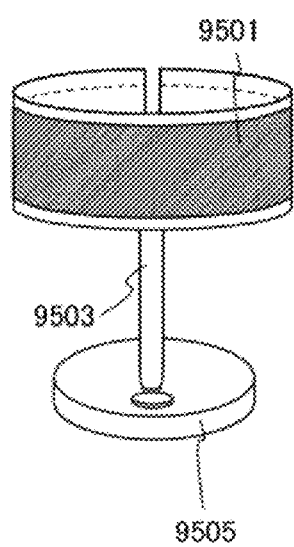

FIG. 18B illustrates another example of the lighting device. A desk lamp illustrated in FIG. 18B includes a lighting portion 9501, a support 9503, a support base 9505, and the like. The lighting portion 9501 includes the light-emitting unit of one embodiment of the present invention. As described above, in one embodiment of the present invention, a lighting device having a curved surface or a lighting device having a flexible lighting portion can be provided. The use of a flexible light-emitting unit for a lighting device as described above not only improves the degree of freedom in design of the lighting device but also enables the lighting device to be mounted onto a portion having a curved surface, such as the ceiling or a dashboard of a car.

This embodiment can be freely combined with any of the other embodiments.

EXPLANATION OF REFERENCE

10: light-emitting unit, 10a to 10c: light-emitting unit, 11: first light-emitting element, 12: second light-emitting element, 13: third light-emitting element, 21: first light-emitting element, 22: second light-emitting element, 23: third light-emitting element, 31: first light-emitting element, 32: second light-emitting element, 41: first light-emitting element, 42: second light-emitting element, 43: third light-emitting element, 51: first light-emitting element, 52: second light-emitting element, 61: first light-emitting element, 62: second light-emitting element, 100: substrate, 100a: first substrate, 100b: second substrate, 102: EL layer, 102a: EL layer, 102b: EL layer, 102c: EL layer, 103: first electrode, 103a: first electrode, 103b: first electrode, 103c: first electrode, 107: partition wall 108: second electrode, 108a: second electrode, 108b: second electrode, 108c: second electrode, 118: uneven structure, 122: uneven structure body, 124: resin layer, 131a: sub wiring, 131b: sub wiring, 131c: sub wiring, 132a: auxiliary wiring, 132b: auxiliary wiring, 132c: auxiliary wiring, 133: wiring, 133a: wiring, 133b: wiring, 134: planarization layer, 135: composite material layer, 150: converter, 160: extraction electrode, 161: extraction electrode, 162: extraction electrode, 163: extraction electrode, 171: sealant, 172: sealant, 173a: first glass layer, 173b: second glass layer, 175: gap, 701: hole-injection layer, 702: hole-transport layer, 703: layer containing light-emitting organic compound, 704: electron-transport layer, 705: electron-injection layer, 706: electron-injection buffer layer, 707: electron-relay layer, 708: composite material layer, 800: first EL layer, 801: second EL layer, 803: charge generation layer, 901: lighting device, 902: lighting device, 903: desk lamp, 904: planar lighting device, 1000: light-emitting device, 1100: light-emitting element, 9501: lighting portion, 9503: support and 9505: support base.

This application is based on Japanese Patent Application serial no. 2010-293919 filed with the Japan Patent Office on Dec. 28, 2011, the entire contents of which are hereby incorporated by reference.

The invention claimed is:
1. A light-emitting unit comprising:
a first light-emitting element, wherein the first light-emitting element comprises:
    a first electrode;
    a second electrode; and
    a first layer containing a first light-emitting organic compound interposed between and in direct contact with the first electrode and the second electrode;
    a first partition wall over and overlapping with an edge portion of the first electrode in a direction vertical to a surface of the first electrode with the first layer interposed therebetween;
a second light-emitting element, wherein the second light-emitting element comprises:
    a third electrode;
    a fourth electrode; and
    a second layer containing a second light-emitting organic compound interposed between and in direct contact with the third electrode and the fourth electrode; and
a second partition wall over and overlapping with an edge portion of the third electrode in the direction with the second layer interposed therebetween,
wherein the first electrode and the third electrode are formed from a first same layer,
wherein the first same layer has a property of transmitting light emitted from the first light-emitting organic compound,
wherein the first partition wall and the second partition wall are formed from a second same layer,
wherein the second electrode overlaps with the edge portion of the first electrode in the direction with the first partition wall interposed therebetween, and is electrically connected to the third electrode,
wherein the first partition wall overlaps with a second edge portion of the third electrode in the direction with the first layer interposed therebetween,
wherein an edge portion of the second electrode overlaps with the second layer in the direction,
wherein an edge portion of the fourth electrode overlaps with the second layer in the direction,
wherein the second electrode and the fourth electrode are electrically insulated from each other over the second layer,
wherein the first layer is in direct contact with the first electrode and the second, electrode,
wherein the second layer is in direct contact with the third electrode and the fourth electrode, and
wherein the third electrode and the first layer are in direct contact with each other.

2. The light-emitting unit according to claim 1, wherein the second electrode and the fourth electrode are formed from a third same layer.

3. The light-emitting unit according to claim 1, wherein the first same layer is a conductive oxide comprising at least indium.

4. A light-emitting device comprising a converter, wherein the light-emitting unit according to claim 1 is driven by output voltage of the converter.

5. A lighting device comprising the light-emitting unit according to claim 1 in a light-emitting portion.

6. The light-emitting unit according to claim 1, wherein each of the first partition wall and the second partition wall has an edge portion with a forward tapered shape.

7. The light-emitting unit according to claim 1, further comprising a substrate having an insulating surface,
wherein the fight light-emitting element is provided over the substrate,
wherein the first electrode is in contact with the insulating surface, and
wherein the second light-emitting element is provided over the substrate.

8. A light-emitting unit comprising:
a first light-emitting element, wherein the first light-emitting element comprises:
    a first electrode;
    a second electrode; and
    a first layer containing a first light-emitting organic compound interposed between and in contact with the first electrode and the second electrode;
a first partition wall over and overlapping with an edge portion of the first electrode in a direction vertical to a surface of the first electrode with the first layer interposed therebetween;
a second light-emitting element, wherein the second light-emitting element comprises:

a third electrode;
a fourth electrode; and
a second layer containing a second light-emitting organic compound interposed between and in contact with the third electrode and the fourth electrode; and
a second partition wall over and overlapping with a first edge portion of the third electrode in the direction with the second layer interposed therebetween,
wherein the first electrode and the third electrode are formed from a first same layer,
wherein the first same layer has a property of transmitting light emitted from the first light-emitting organic compound,
wherein the first partition wall and the second partition wall are formed from a second same layer,
wherein the second same layer comprises a composite material containing an organic compound and an electron acceptor, or an insulator,
wherein the second electrode overlaps with the edge portion of the first electrode in the direction with the first partition wall interposed therebetween, and is electrically connected to the third electrode,
wherein the first partition wall overlaps with a second edge portion of the third electrode in the direction with the first layer interposed therebetween,
wherein an edge portion of the second electrode overlaps with the second layer in the direction,
wherein an edge portion of the fourth electrode overlaps with the second layer in the direction,
wherein the second electrode and the fourth electrode are electrically insulated from each other over the second layer,
wherein the first layer is in direct contact with the first electrode and the second electrode,
wherein the second layer is in direct contact with the third electrode and the fourth electrode, and
wherein the third electrode and the first layer are in direct contact with each other.

9. The light-emitting unit according to claim 8, wherein the second electrode and the fourth electrode are formed from a third same layer.

10. The light-emitting unit according to claim 8, wherein the first same layer is a conductive oxide comprising at least indium.

11. A light-emitting device comprising a converter, wherein the light-emitting unit according to claim 8 is driven by output voltage of the converter.

12. A lighting device comprising the light-emitting unit according to claim 8 in a light-emitting portion.

13. The light-emitting unit according to claim 8, wherein each of the first partition wall and the second partition wall has an edge portion with a forward tapered shape.

14. The light-emitting unit according to claim 8, further comprising a substrate having an insulating surface,
wherein the first light-emitting element is provided over the substrate,
wherein the first electrode is in contact with the insulating surface, and
wherein the second light-emitting element is provided over the substrate.

15. A light-emitting unit comprising:
a first electrode;
a second electrode;
a third electrode;
a fourth electrode;
a first layer containing a first light-emitting organic compound interposed between the first electrode and the second electrode;
a second layer containing a second light-emitting organic compound interposed between the third electrode and the fourth electrode; and
a first partition wall,
wherein the second electrode overlaps with an edge portion of the first electrode in a direction vertical to a surface of the first electrode with the first partition wall interposed therebetween, and is electrically connected to the third electrode,
wherein an edge portion of the second electrode overlaps with the second layer in the direction,
wherein the first partition wall overlaps with an edge portion of the third electrode in the direction with the first layer interposed therebetween,
wherein the first layer is in direct contact with the first electrode and the second electrode,
wherein the second layer is in direct contact with the third electrode and the fourth electrode, and
wherein the third electrode and the first layer are in direct contact with each other.

16. The light-emitting unit according to claim 15, wherein the first electrode and the third electrode are formed from a first same layer, and
wherein the first same layer has a property of transmitting light emitted from the first light-emitting organic compound.

17. The light-emitting unit according to claim 15, wherein the second electrode and the fourth electrode are electrically insulated from each other over the second layer.

18. The light-emitting unit according to claim 15, wherein an edge portion of the fourth electrode overlaps with the second layer in the direction.

19. The light-emitting unit according to claim 15, wherein the second electrode and the fourth electrode are formed from a second same layer.

20. The light-emitting unit according to claim 16, wherein the first same layer is a conductive oxide comprising at least indium.

21. The light-emitting unit according to claim 15, wherein the first partition wall has an edge portion with a forward tapered shape.

22. The light-emitting unit according to claim 15, further comprising a substrate having an insulating surface,
wherein the first electrode is provided over the substrate and in contact with the insulating surface, and
wherein the third electrode is provided over the substrate.

* * * * *

UNITED STATES PATENT AND TRADEMARK OFFICE
CERTIFICATE OF CORRECTION

| | | |
|---|---|---|
| PATENT NO. | : 9,905,632 B2 | Page 1 of 1 |
| APPLICATION NO. | : 13/331108 | |
| DATED | : February 27, 2018 | |
| INVENTOR(S) | : Shunpei Yamazaki | |

It is certified that error appears in the above-identified patent and that said Letters Patent is hereby corrected as shown below:

In the Specification

At Column 39, Lines 60, "3-yOtri" should be --3-yl)tri--;

At Column 40, Line 23, "(abbreviation: Flrpic)," should be --(abbreviation: FIrpic),--;

At Column 41, Line 44, "diyOdiphenanthrene" should be --diyl)diphenanthrene--;

At Column 41, Line 46, "triyOtripyrene" should be --triyl)tripyrene--;

At Column 42, Lines 21-22, "(N,N'-diphenyl amino)" should be --(N,N'-diphenyl-amino)--;

At Column 46, Line 18, "N,N-bis" should be --N,N'-bis--;

At Column 46, Line 19, "naphthalenetetracar boxylic" should be --naphthalenetetracarboxylic--;

In the Claims

In Claim 1, at Column 47, Line 53, "direct contact" should be --contact--;

In Claim 1, at Column 47, Lines 64-65, "direct contact" should be --contact--;

In Claim 1, at Column 48, Line 1, "an edge" should be --a first edge--;

In Claim 1, at Column 48, Line 26, "second, electrode" should be --second electrode--;

In Claim 7, at Column 48, Line 48, "fight" should be --first--.

Signed and Sealed this
First Day of May, 2018

Andrei Iancu
*Director of the United States Patent and Trademark Office*